United States Patent
Yamamoto et al.

(10) Patent No.: US 8,810,547 B2
(45) Date of Patent: Aug. 19, 2014

(54) DRIVING DEVICE FOR INFORMATION PROCESSING SYSTEM USING MULTI-TOUCH FUNCTION

(71) Applicants: Takashi Yamamoto, Kawasaki (JP); Masayuki Mori, Sakai (JP); Takashi Kondo, Ogaki (JP)

(72) Inventors: Takashi Yamamoto, Kawasaki (JP); Masayuki Mori, Sakai (JP); Takashi Kondo, Ogaki (JP)

(*) Notice: Subject to any disclaimer, the term of this patent is extended or adjusted under 35 U.S.C. 154(b) by 0 days.

(21) Appl. No.: 14/093,821

(22) Filed: Dec. 2, 2013

(65) Prior Publication Data

US 2014/0092062 A1    Apr. 3, 2014

Related U.S. Application Data

(63) Continuation of application No. 13/177,196, filed on Jul. 6, 2011, now Pat. No. 8,669,965.

(30) Foreign Application Priority Data

Sep. 16, 2010 (JP) ................................ 2010-208419

(51) Int. Cl.
*G06F 3/044* (2006.01)

(52) U.S. Cl.
USPC .......................................................... 345/174

(58) Field of Classification Search
USPC .................................. 345/173–176; 715/12, 18
See application file for complete search history.

(56) References Cited

U.S. PATENT DOCUMENTS

| 7,479,949 B2 | 1/2009 | Jobs et al. |
| 2008/0150906 A1* | 6/2008 | Grivna ........................ 345/173 |
| 2010/0164889 A1* | 7/2010 | Hristov et al. ............... 345/173 |

* cited by examiner

*Primary Examiner* — Andrew Sasinowski
(74) *Attorney, Agent, or Firm* — Westerman, Hattori, Daniels & Adrian, LLP

(57) ABSTRACT

A driving device includes a base and a conductive pattern portion provided on a surface of the base. The conductive pattern portion has a finger touch portion, touching portions and conductive connecting portions connecting the finger touch portion and each of the touching portions. When a surface of the base is contacted with a multi-touch display of an information processor, each of the touching portions activates a corresponding touching area of the multi-touch display. Thus, a predetermined action is executed by the information processor.

6 Claims, 21 Drawing Sheets

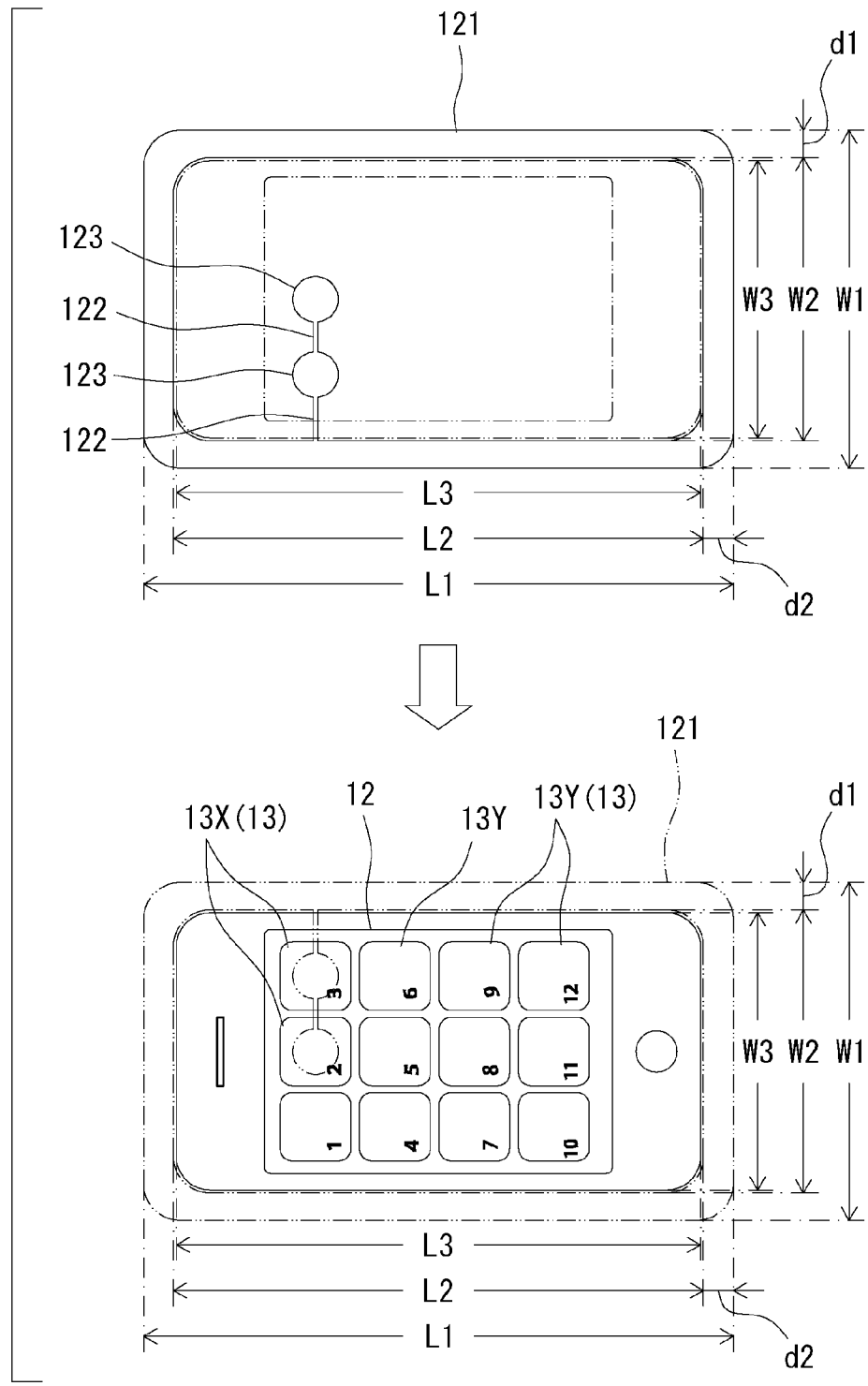

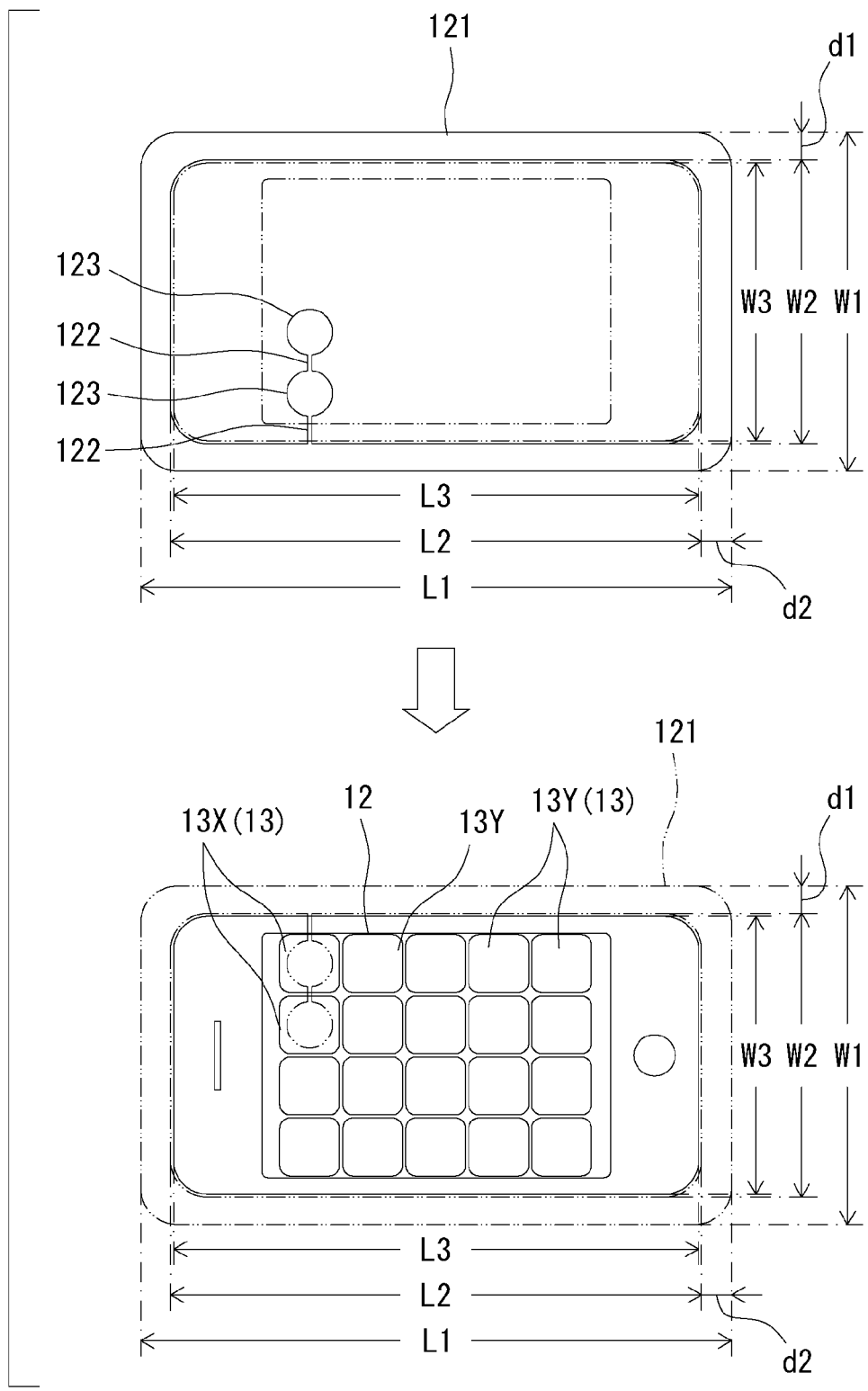

F I G. 9
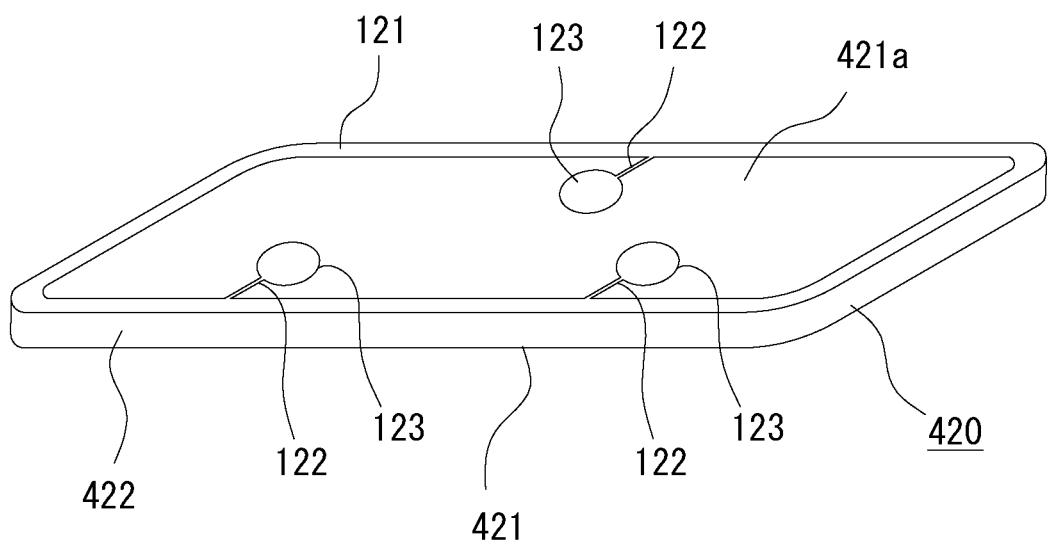

F I G. 1 6 B
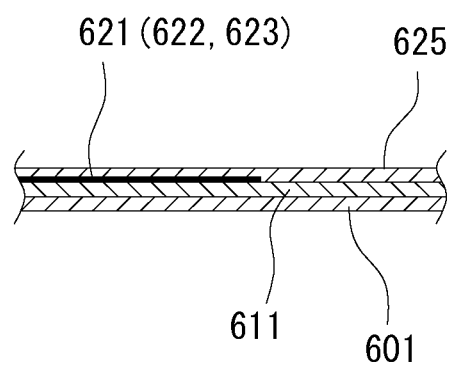

FIG. 20
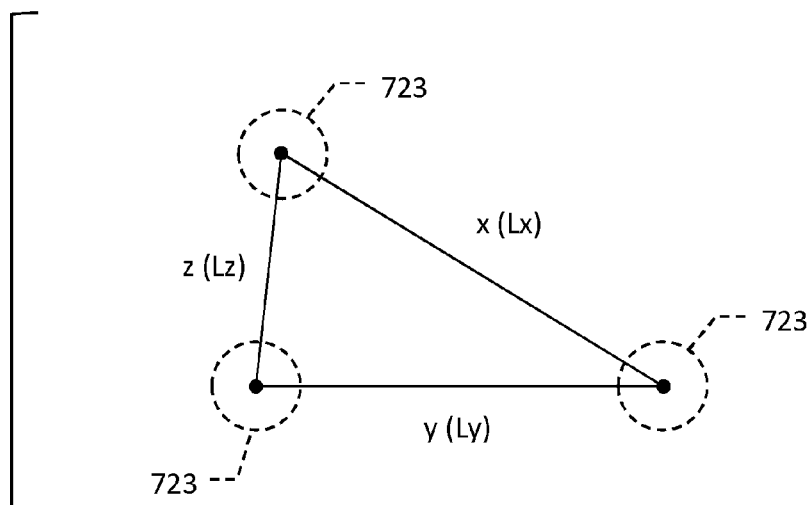
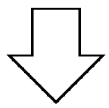
| Side (x) | Length (Lx) |
|---|---|
| x1 | 9 |
| x2 | 8 |
| x3 | 7 |
| x4 | 6 |
| x5 | 5 |
| x6 | 4 |
| Side (y) | Length (Ly) |
|---|---|
| y1 | 8 |
| y2 | 7 |
| y3 | 6 |
| y4 | 5 |
| y5 | 4 |
| y6 | 3 |
| Side (z) | Length (Lz) |
|---|---|
| z1 | 7 |
| z2 | 6 |
| z3 | 5 |
| z4 | 4 |
| z5 | 3 |
| z6 | 2 |
| Combination | |
|---|---|
| c1 | x1, y1, z1 |
| c2 | x1, y1, z2 |
| c3 | x1, y1, z3 |
| ⋮ | ⋮ |
| cm | x3, y3, z5 |
| ⋮ | ⋮ |
| c56 | x6, y6, z6 |

DRIVING DEVICE FOR INFORMATION PROCESSING SYSTEM USING MULTI-TOUCH FUNCTION

CROSS-REFERENCE TO RELATED APPLICATIONS

This is a continuation application of U.S. patent application Ser. No. 13/177,196, filed on Jul. 6, 2011, which claims the benefit of priority from the prior Japanese Patent Application No. 2010-208419, filed on Sep. 16, 2010, the entire contents of which are incorporated herein by reference.

BACKGROUND OF THE INVENTION

1. Field of the Invention

This invention relates to a driving device for an information processing system using multi-touch function, particularly to a driving device that touches a capacitance type multi-touch display of an information processing device to cause the information processing device to execute a desired information process, wherein the driving device is provided as a separate and individual body and constitutes a pair with the information processing device.

2. Description of the Related Art

In recent years, an information processing device having a touch panel has been developed to execute a variety of processes when a user touches it by his or her finger. Particularly, in these days, an information processing device having a multi-touch display (also called as multi-touch screen or multi-touch panel) has become widespread to execute more various processes. U.S. Pat. No. 7,479,949 discloses an information processing device having a multi-touch display.

It is common in the conventional information processing devices having touch-panel that a predetermined process is executed by the information processing device by directly touching a fixed position of the display by a finger or a touch pen (so called "single pointing"). On the other hand, the information processing device having the multi-touch display enables a user to touch plural fingers to plural position of the multi-touch display or to move the fingers in a desired direction while keeping the touched condition of the fingers, in addition to the single pointing action. That is, it is possible to execute a variety of processes according to the number and positions of touched points or to each moving locus of the fingers.

However, in case plural touching points are designated or defined beforehand at the side of the multi-touch display, particularly when the multi-touch display is small-scale, it is sometimes troublesome or difficult for the user to correctly touch the plural touching points with the plural fingers. Thus, there is a large room for improvement in terms of a rapid and accurate processing by touching of plural fingers. Moreover, there will be quite large variety of contents obtained by the multi-touch information processing using the information processing device with the multi-touch display. From such view, it is expected that a utility of the information processing device with the multi-touch display be greatly improved if a device is provided to enable a simple and accurate multi-touch action in comparison with the conventional ones.

BRIEF SUMMARY OF THE INVENTION

In view of the above, it is an object of the present invention to provide a driving device for an information processing system using a multi-touch function that is combined as a separate and individual driving device with an information processing device having a capacitive multi-touch display, while constituting a pair with the information processing device, so as to enable a simple and accurate multi-touching on the multi-touch display, thereby making it possible to simultaneously touch predetermined plural touching positions with accuracy and realizing a desired multi-touch function for the multi-touch display with a simple structure.

According to one aspect of the invention, there is provided a driving device adapted to be connected to an information processing device having a capacitive multi-touch display. The driving device comprises: a base made of an electrically insulating body; and a conductive pattern portion disposed at one side surface of the base. The driving device serves to cause the information processing device to execute a proper action when the driving device is touched with the multi-touch display. The conductive pattern portion has a finger touch portion, a conductive connecting portion and a plurality of touching portions. Each of the touching portions is made of an electrically conductive body having a touching area of a predetermined dimension that comes into a touched or nearly touched state with the multi-touch display. The finger touch portion is made of a planar shape of conductive body layer provided on one end portion of the base. The conductive connecting portion is made of an electrically conductive body electrically connecting the finger touch portion and each of the touching portions. The touching area of each of the touching portions is set at a value not less than a minimum detection area of the multi-touch display. The conductive connecting portion is provided on the base so as to be kept from activating a touching area of the multi-touch display by a capacitive coupling between the touching area of the multi-touch display and itself. The finger touch portion is provided on the one end portion of the base only at a predetermined location where a finger of a user naturally touches.

Further objects and advantages of the invention will be apparent from the following description, reference being had to the accompanying drawings, wherein preferred embodiments of the invention are clearly shown.

BRIEF DESCRIPTION OF THE SEVERAL VIEWS OF THE DRAWINGS

FIG. 3 is a plan view showing a relationship (particularly a dimensional relationship) between the information processing device and the driving device of the information processing system according to the first embodiment of the invention.

FIG. 4 is a plan view showing a relationship (particularly a dimensional relationship) between the information processing device and a driving device of an information processing system according to a second embodiment of the invention.

FIG. 9 is a schematic view showing a driving device of an information processing system according to a seventh embodiment of the invention.

FIG. 16B is a cross-sectional view showing a conductive pattern portion, in part, of the driving device of the ninth embodiment.

FIG. 20 is an explanatory drawing showing an example of a congruency judging program of the information processing system according to the tenth embodiment of the invention.

DETAILED DESCRIPTION OF THE INVENTION

Figure 1:
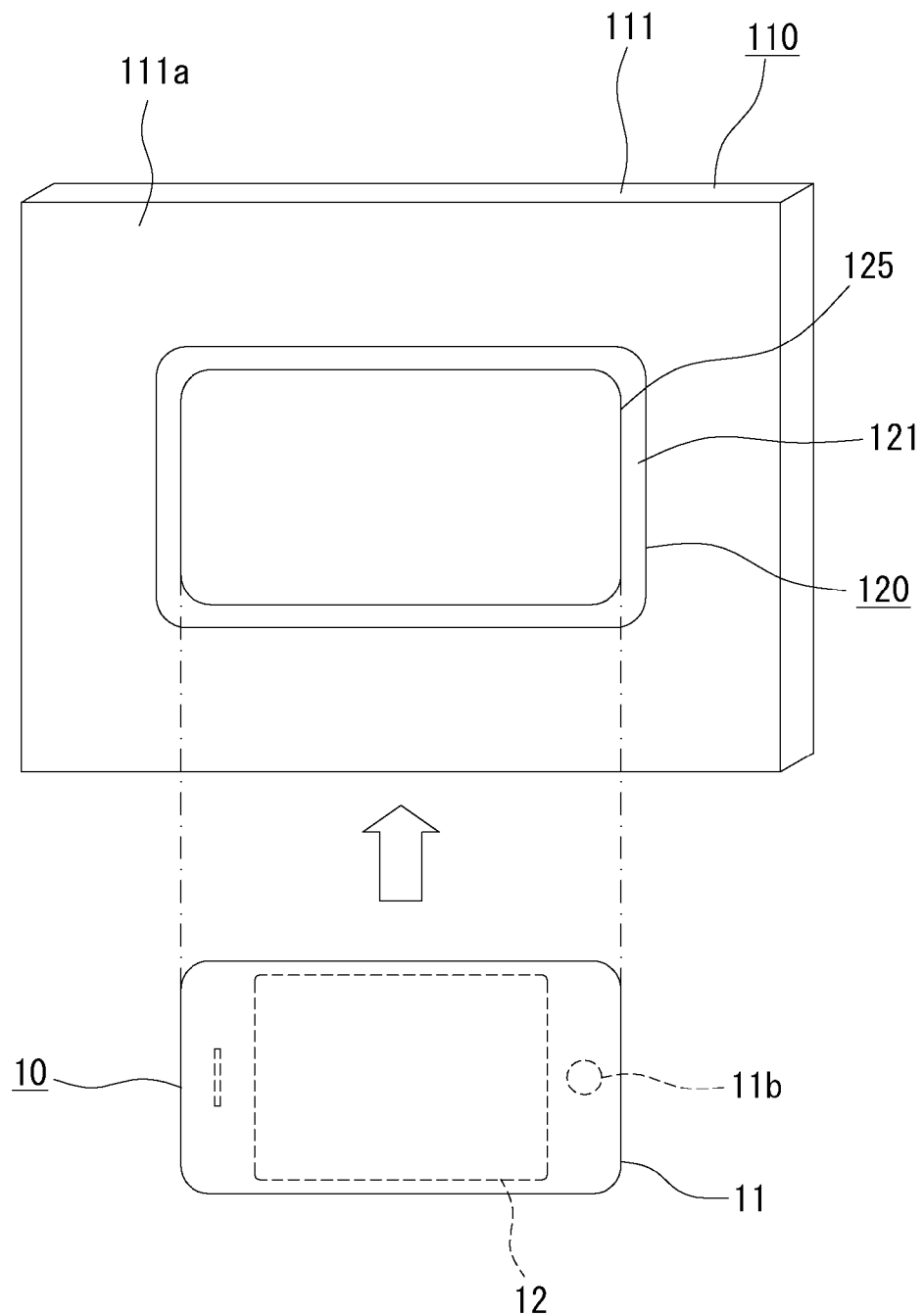
FIG. 1 is a plan view schematically showing an information processing device and a driving device constituting an information processing system according to a first embodiment of the invention.

Several embodiments of the invention are described hereunder referring to the attached drawings. The same reference character is used to show the same element throughout the several embodiments.

As shown in FIG. 3, an information processing system according each embodiment of the invention includes an information processing device (information processor) 10 having a multi-touch display 12 and a driving device (drive unit) (210 or the like). The drive unit serves to drive a predetermined information processing or to start an action like event in accordance with a prescribed program installed or stored in the information processor 10. The multi-touch display 12 includes a capacitive multi-touch sensor. Typically, such kind of multi-touch display has a capacitive touch screen sensor such as a projected capacitive touch screen sensor as a typical example. This type of multi-touch display executes a predetermined action by detection of a capacitance change when an electrostatic conductor such as a human finger is electrostatically coupled with the multi-touch display. The multi-touch display conducts the multi-touch action with a "finger-like object", in addition to the human finger, as long as it corresponds to the human finger (to change the capacitance in a touching state or in substantially a touching state with the multi-touch display in the same manner as the human finger). Accordingly, the "finger-like object" as a term used in the present invention includes every object that, when touching the touch display, is able to start or execute a prescribed processing or action such as a touch event in the same way as the finger directly touching the touch display. That is, since the present invention uses the capacitive touch panel (such as a projected capacitive type or the like) as the multi-touch display, the finger-like object may be any bodies (electrostatic conductor) that is able to change the capacitance of the touch display when touching it or coming near it in the same way as the finger. In the specification and claims of the present application, the finger or the finger-like object may be referred to as "finger-like body" as a generic term.

First Embodiment

Overall Structure

An information processing system according to the first embodiment includes the information processor 10, typically represented by a mobile information terminal such as a smart phone, and a drive unit 110 to cause the information processor 10. Specifically, as shown in FIG. 1, the drive unit 110 has a base 111. The base 111 has a base surface 111a at one side in the thickness direction. A electrically conductive pattern portion 120 as a driving portion is integrally provided on the base surface 111a of the base 111. The drive unit 110 provides a fixed pattern of the conductive pattern portion 120 on a fixed structure of the base 111 so that it can be used by being installed or located fixedly or detachably or movably on a predetermined installed surface at an interior or exterior location. The base 111 is made of an electrically insulating material (dielectric material) such as a paper material (drawing paper or sticker or the like) or a wood material (wood board or the like). On the other hand, as shown in FIG. 3, the multi-touch display 12 occupies a major area of a base portion 11 of the information processor 10. The multi-touch display 12 sets and arranges square buttons 13 therein, for example, twelve buttons in a matrix of four rows and three columns. Among the buttons 13, when a fixed combination of plural buttons 13X is touched and simultaneously driven without touching the other buttons 13Y, the multi-touch display 12 conducts a prescribed action corresponding thereto. The button 13X is an area to individually detect a touch or proximity of the finger or the finger-like object by capacitance change. The drive unit 110 is applied to the information processor 10 in which plural (two or more) touching areas 13X (13) are arranged in a separated manner inside a fixed area of the multi-touch display 12. That is, the first embodiment of the information processing system uses the drive unit 110 to cause the information processor 10 to execute a prescribed event so as to conduct a predetermined information processing action.

[Base]

Figure 2A:
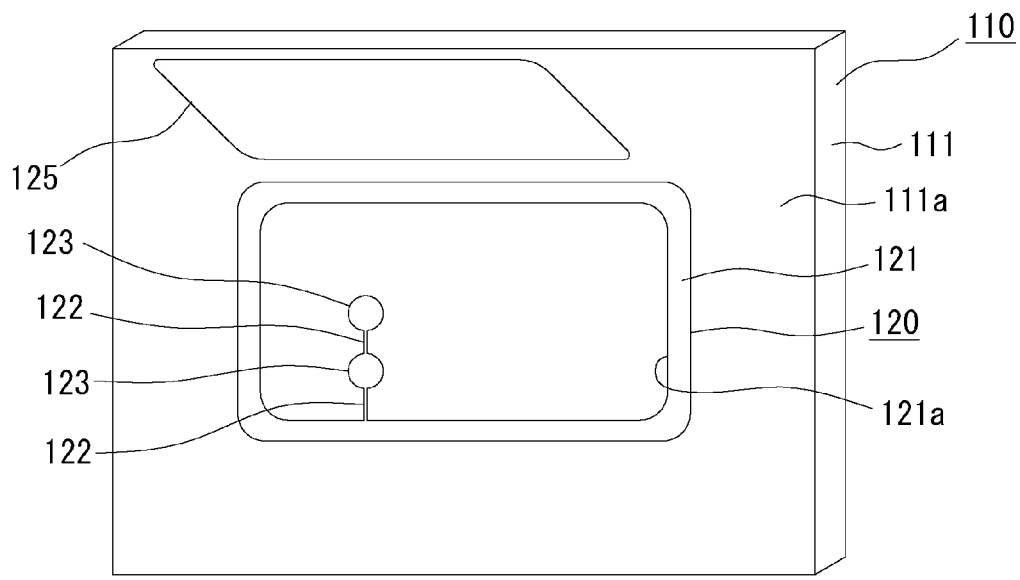
FIG. 2A is a perspective view showing an internal structure of the driving device of the first embodiment of the information processing system by peeling off a shielding sticker for shielding a conductive portion of the driving device.
Figure 2B:
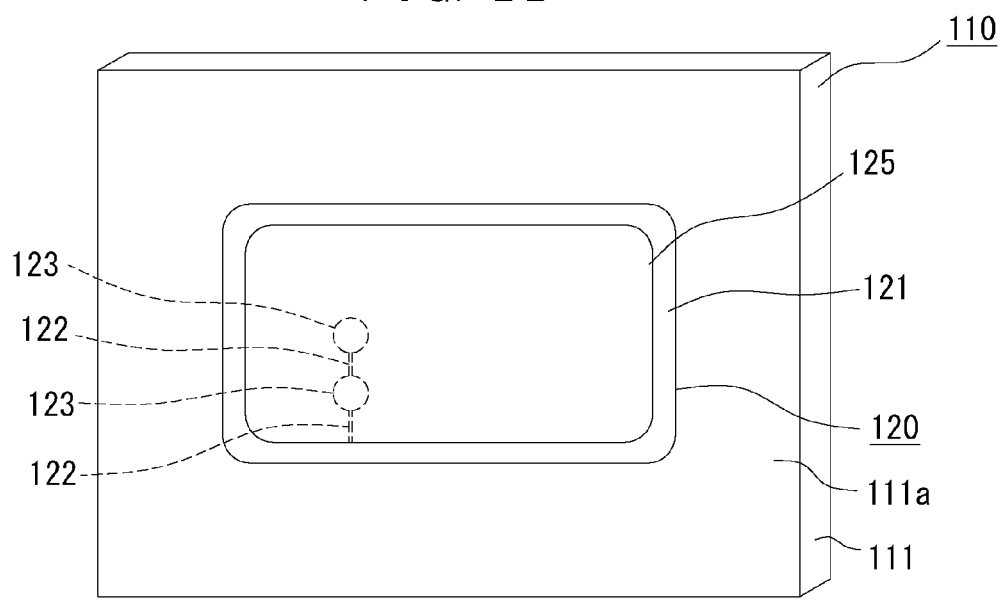
FIG. 2B is a perspective view showing an exterior appearance (in a used state) of the driving device by shielding the conductive portion of the driving device with the shielding sticker.

As shown in FIG. 1 and FIG. 2A and FIG. 2B, the base 111 is a solid body having a fixed shape such as a flat board shape and is made of the insulating body or the dielectric body as an electrically non-conductive body. That is, the base 111 may be formed by an insulating material such as a normal synthetic resin or a rubber except an electrically conductive material such as an electrically conductive resin. Moreover, the base 111 may be made of any electrically non-conductive materials such as (non-conductive) common wood materials (wood boards or the like), common fiber materials (that is non-conductive and excludes conductive fibers), common paper materials (that is non-conductive and excludes conductive papers). The base 111a is composed of a surface constituting one side of the base 111. The base surface 111a is a surface on which the conductive pattern portion 120 is integrally formed on a fixed range of area so as to expose the conductive pattern portion 120. Typically, the base surface 111a is provided at a center part of the one side of the base 111 or a left part or a right part thereof so that the conductive pattern portion 120 is integrally formed at a fixed area thereof in an exposed manner. Thus, the base surface 111a may have any shape, in addition to the rectangular plan shape as in the present embodiment, such as a circular shape, an oval shape, a polygonal shape except a rectangular shape, or other deformed shape (a shape having a desired outline or contour like star shape).

[Conductive Pattern Portion]

As shown in FIG. 2, the conductive pattern portion 120 uses a conductive coating material such as an conductive ink or a conductive paint. The conductive pattern portion 120 is integrally formed on a fixed range of area of the base surface 111a of the base 111 by use of a coating forming technique. The conductive pattern portion 120 is formed such that an electric charge accumulating portion 121, conductive connecting portions 122 and touching portions 123 are arranged in a conductive patter as shown in the drawings. Moreover, the conductive pattern portion 120 is applied with a printed-wiring technique or a conductive pattern forming technique by a conductive trace pen. A desired pattern of the conductive pattern portion 120 is formed on the base surface 111a of the base 111. As a conductive coating material for making the conductive pattern portion 120, a conductive ink or the like is preferably used. In addition, any ones may be used as long as it has a good electrical conductance and is able to form a coating on the base surface 111a of the base 111. Moreover, any coating forming technique may be used for the coating of the conductive pattern portion 120 in addition to the printing technique in case of using the conductive ink.

In case the coating is formed by use of the printing technique, the base 111 may be formed by a variety of bases for printing such as a thin sheet material like paper or cloth, a thick sheet material having a certain thickness like a wood board or a synthetic resin board or a block-shaped material. For a printing base made of a synthetic resin material, a transparent, semi-transparent or colored transparent synthetic resin base may be used.

[Electric Charge Accumulating Portion]

As shown in FIG. 2A and FIG. 2B, the electric charge accumulating portion 121 acts as a capacitance increasing portion of the conductive pattern portion 120. The accumulating portion 121 is formed such that a fixed width of a coating pattern is formed to make a rectangular frame shape as a planar shape with the fixed pattern width. The accumulating portion 121 defines or regulates an outline or contour of the entirety of the conductive pattern portion 120. Moreover, the accumulating portion 121 has an inner peripheral edge formed into a rectangular shape having rounded corners that is substantially the same as a rectangular shape having rounded corners defined by an outer peripheral edge of the information processor 10 itself (overall shape thereof). A width (dimension between the inner peripheral edge and the outer peripheral edge) of the accumulating portion 121 is a dimension corresponding to a finger tip (inside part) of a human finger (particularly a thumb or an index finger). For example, the width of the accumulating portion 121 may be set within a range of about 3 mm to about 10 mm, preferably, within a range of about 4 mm to about 9 mm, more preferably, within a range of about 5 mm to about 8 mm, still more preferably within a range of about 6 mm to about 7 mm.

The base surface 111a of the base has a "facing surface" to face the multi-touch display 12. The facing surface is a portion that is located within an surface area surrounded by the inner peripheral edge of the accumulating portion 121 of the conductive pattern portion 120 and that is to face the multi-touch display 12 when aligning the information processor 10 to the inner peripheral edge of the accumulating portion 121. Accordingly, in the present embodiment of the drive unit 110, the accumulating portion 121 is disposed beyond an outer peripheral edge of the facing surface (touching surface with the multi-touch display 12) of the base surface 111a of the base 111, while keeping an interval equivalent to an interval between the outer peripheral edge of the information processor 10 and the outer peripheral edge of the multi-touch display 12.

[Touching Portion]

Each of the connecting portions 122 of the conductive pattern portion 120 has a linear shape of a fixed width in plan view. Each of the touching portions 123 has a circular shape having a fixed diameter in plan view. Among them, the touching portions 123 are located at predetermined positions corresponding to (i.e. so as to constitute a mirror symmetry with) the plural buttons 13X of the multi-touch display 12 in the facing surface (center surface part surrounded by the accumulating portion 121) of the base surface 111a of the base 111, respectively. The touching portion 123 may have a desired shape (e.g. polygon such as ellipse, triangle, rectangle, pentagon, hexagon, octagon, or other deformed shape such as star shape) and a desired area (dimension), in addition to the circle as illustrated, as long as it has a shape and an area that is able to drive the buttons 13X by capacitance change. Preferably, the touching portion 123 is formed with an area as large as possible within a range of the outline or contour of the button 13 set in the multi-touch display 12 to assure exact completion of an event of the button 13 by capacitive coupling or electrostatic induction at the part of the button 13. For example, in case the touching portion 123 is formed into a circle, its diameter is set at substantially the same as or slightly smaller (by tenth or hundredth of a millimeter) than the width of the square button 13. In the example of FIG. 2A and FIG. 2B, two touching portions 123 are disposed in series and at a little distance in the width direction of the conductive pattern portion 120 on the assumption that two buttons 13X adjacent in the width direction of the multi-touch display 12 are activated. Still, the way of arranging and the number of the touching portions 123 coincide with the way of arranging and the number of the buttons 13 that are activated simultaneously.

[Conductive Connecting Portion]

The connecting portions 122 electrically connect the accumulating portion 121 with the touching portions 123, respectively. In the example of FIG. 2A and FIG. 2B, there are provided connecting portions 122 for connecting two touching portions 123 with each other and connecting portions 122 for connecting the touching portions 123 at the outside (at the side of the accumulating portion 121) with a corresponding linear portion of the accumulating portion 121. That is, two connecting portions 122 are disposed in series to connect two touching portions 123 with the linear portion of the accumulating portion 121, corresponding to two touching portions 123 that are arranged in series. The connecting portions 122 may have any desired constructions and ways of arranging as long as they conduct the electric charges of each of the touching portions 123 to the accumulating portion 121. For example, in case of FIG. 2A and FIG. 2B, the connecting portions 122 may be wired such that each of the touching portions 123 is conducted to separate and different positions of the accumulating portion 121.

As shown in FIG. 3, the touching portions 123 of the conductive pattern portion 120 are provided in a plural number (e.g. two or three) that is less than the total number of the buttons 13 as the touching areas of the multi-touch display 12 of the information processor 10. Moreover, the touching portions 123 are located at positions corresponding to the plural buttons 13X selected from the buttons 13 (i.e. positions of mirror symmetry to the buttons 13X when the multi-touch display 12 is matched with the facing surface at the inside of the accumulating portion 121). The dimensional area of the connecting portion 122 is set at one largely smaller than the area of the touching portion 123. For example, the width of the connecting portion 122 may be set about ⅕ to about 1/15 of the diameter of touching portion 123 (preferably about ⅛ to about 1/12, more preferably about 1/10), so that the connecting portion 122 is extended linearly between two adjacent touching portions 123. Thus, the area of the connecting portion 122 determined by the width and the length of the connecting portion 122 is set smaller to a certain degree than the area of the touching portion 123. Thereby, in case of electrically connecting the adjacent touching portions 123 and connecting the touching portion 123 with the accumulating portion 121, the multi-touch display 12 is prevented from reacting (or changing the capacity) with the connecting portions 122 and surely reacts only with the touching portions 123. That is, the area (particularly the width) of the connecting portion 122 is set at such an area (particularly a width) that the multi-touch display 12 does not react with the connecting portions 122 even by touching the connecting portions 122. Therefore, the connecting portion 122 may have any desired shape or dimension as long as it electrically connects the adjacent touching portions 123 or connects the touching portion 123 with the accumulating portion 121 and as long as the multi-touch display 12 does not react with the connecting portions 122.

[Shielding Seal]

A shielding seal or sticker 125 closely adheres by adhesion or sticking to the base surface 11a of the base 111 at an inside of the inner peripheral edge of the accumulating portion 121 of the conductive pattern portion 120. The shielding seal 125 completely surrounds the facing surface (that is matched to the multi-touch display 12), while completely shielding the entire surface at the inside of the inner peripheral surface of the accumulating portion 121. The shielding seal 125 is made of a material similar to a common sticker seal material and is an insulating material or a dielectric material in itself. Moreover, the shielding seal 125 has a sheet shape of the same area and the same shape (same outline or contour) as the inside surface defined by the inner peripheral edge of the accumulating portion 121. The shielding seal 125 is joined and accurately matched to the inner peripheral edge of the accumulating portion 121 on the base surface 111a of the base. The shielding seal 125 shields all the connecting portions 122 and the touching portions 123 from the exterior, while exposing the entire accumulating portion 121 to the outside from the outer peripheral edge of the shielding seal 125 so that the accumulating portion 121 is closely contacted with the outer peripheral edge of the shielding seal 125. Accordingly, the accumulating portion 121 is closely contacted with the outer peripheral edge of the shielding seal 125 that is joined to the base 111 and is provided with a fixed width (pattern width) at the outside from the outer peripheral edge of the shielding seal 125. Moreover, a thickness of the shielding seal 125 is tenth or hundredth of millimeter. Then, when the multi-touch display 12 comes very near to the touching portions 123 of the conductive pattern portion 120 via the shielding seal 125, the corresponding buttons 13X of the multi-touch display 12 are surely activated by the touching portions 123.

[Electric Charge Movement of Charge Accumulating Portion]

As shown in FIG. 3, in the conductive pattern portion 120 of the driving device 110, a width W1 of the outer peripheral edge of the accumulating portion 121 becomes the largest width in the conductive pattern portion 120 as a whole, while a length L1 of the outer peripheral edge of the accumulating portion 121 becoming the largest length in the conductive pattern portion 120 as a whole. Moreover, a width W2 of the inner peripheral edge of the accumulating portion 121 is smaller by a width d1 than the width W1 that is a width of a longitudinally extending strip of the conductive pattern portion 120. A length L2 of the inner peripheral edge of the accumulating portion 121 is smaller by a width d2 than the length L1 that is a length of a laterally extending strip of the conductive pattern portion 120. Here, the width d1 equals to the width d2. On the other hand, the width W2 is set at a value same as or slightly larger than a width W3 of the information processor 10. The length L2 is set at a value same as or slightly larger than a length L3 of the information processor 10.

Thus, if the multi-touch display 12 is pressed to the facing surface of the base 111, while the outer peripheral edge of the information processor 10 being aligned precisely with the outer peripheral edge of the shielding seal 125, the buttons 13X of the multi-touch display 12 face and come very near to the corresponding touching portions 123 of the conductive pattern portion 120 in a precisely positioned manner. At the same time, no reactive surface of the multi-touch display 12 faces or touches the accumulating portion 121 of the conductive pattern portion 120. Therefore, the multi-touch display 12 is kept from touching the accumulating portion 121 and any malfunction of the multi-touch display 12 but such touching is surely prevented. Moreover, when the user grasps the information processor 10 by his or her fingers to press the multi-touch display 12 to the facing surface of the base 111, the finger tip naturally touches the accumulating portion 121. That is, the accumulating portion 121 of the planar shape is disposed in the same plane as or a plane successive to the facing surface of the base 111. Then, the accumulating portion 121 is disposed by the fixed width (width allowing the transfer of the electric charges through the finger tip) at a location where the finger tip naturally touches. Accordingly, the accumulating portion 121 is conducted with the finger of the user, so that the electric charges from the touching portions 123 are transferred through the connecting portions 122 to the user. As a result, in the conductive pattern portion 120, an amount of capacitance change at the touching portions 123 corresponding to the buttons 13X of the multi-touch display 12 can be amplified very much by the accumulating portion 121. Therefore, it is possible to activate only the predetermined buttons 13X without fail.

[Reception/Accumulation of Electric Charges by Accumulating Portion]

As described above, the accumulating portion 121 may serve as an exposed portion to make the finger of the user touch thereto. In this case, if the accumulating portion 121 is constructed as an exposed surface having an area larger than an area of a human finger tip at a location where the finger tip of the user naturally touches, it can move the electric charges from the touching portions 123 to the human body, so that the buttons 13X can be activated for sure via the human body. On the other hand, even if the accumulating portion 121 is exposed at the outer peripheral side of the shielding seal 125 as shown in FIG. 1 or is enclosed at the inside of the shielding seal 125 (not shown), the accumulating portion 121 is constructed such that it receives and accumulates the electric charges, which are required for activating each button 13X of the multi-touch display 12, from the touching portions 123 through the connecting portions 122. That is, the inventors have found the following facts. Specifically, in case the conductive pattern portion 120 is not provided with any accumulating portion 121 and consists only of the touching portions 123 (and the connecting portions 122 connecting the touching portions 123), for example, a total area of the touching portions 123 (and the connecting portions 122) is largely insufficient for changing the capacitance of the buttons 13X of the multi-touch display 12, thereby making it difficult to activate the buttons 13X. Then, the inventors conducted repeatedly keen experiments and research and developments in order to solve such problem. As a result, as a structure to surely activate the buttons 13X, the accumulating portion 121 of a large area (compared with the touching portions 123) is additionally provided so as to surround the outside of the touching portions 123 as a whole and to be located at the outside of the multi-touch display 12. At the same time, the accumulating portion 121 is conducted with the touching portions 123. Thus, the electric charges transmitted from the buttons 13X to the touching portions 123 are received and accumulated in the accumulating portions 121 via the connecting portions 122. Consequently, a large capacitance change is acquired at the buttons 13X. That is, in this case, the electric charges at the buttons 13X do not flow to a grounded part via the human body. However, it is presumed that a sufficient amount of charge transfer and capacitance change is generated at the buttons 13X by an electrostatic induction or the like caused by the accumulating portion 121, thereby activating the buttons 13X for sure. It is also presumable that the capacitance at the button 13X is changed via the touching portion 123 by the electric charges that have been accumulated in the accumulated portion 121 by then, thereby activating the buttons 13X for sure. In this case, it is unnecessary that the finger of the user touches the accumulating portion 121. Consequently, the accumulating portion 121 is not always located at the outside of the shielding seal 125. Alternatively, the shielding seal 125 may be formed into a dimension covering even the accumulating portion 121 so as to shield the entire accumulating portion 121. Still, in such case, a frame border (inner frame border) is preferably provided as a mark on the inside of the outer peripheral edge of the shielding seal 125 and at a location that matches the inner peripheral edge of the accumulating portion 121 (at an underside of the shielding seal 125). The mark enables a user to accurately position the multi-touch display 12 at the inside of the inner peripheral edge of the accumulating portion 121 or to locate and match the outer peripheral edge of the multi-touch display 12 to the inner peripheral at the accumulating portion 121.

Accordingly, the present embodiment focuses on the formation pattern and the pattern width d1, d2 of the accumulating portion 121 in order to assure such large area of the accumulating portion 121. Specifically, as described above, the accumulating portion 121 is formed into a rectangular frame shape surrounding the facing surface of the base 111, while being separated by a fixed distance at the outside of the facing surface. Moreover, the width d1, d2 is set within a range of about 3 mm to about 10 mm, preferably within a range of about 4 mm to about 9 mm, more preferably within a range of about 5 mm to about 8 mm, still more preferably within a range of about 6 mm to about 7 mm. Consequently, a sufficient amount of capacitance change is produced at the button 13X only by making the multi-touch display 12 locate and touch the inside of the facing surface of the base 111 and without making the finger of the user touch with the accumulating portion 121 of the conductive pattern portion 120. Then, a prescribed event is generated by the button 13X. That is, the accumulating portion 121 can be understood as an electric-charged portion that stores the electric charges beforehand so as to enable a sufficient amount of charge transfer required for the above-mentioned capacitance change.

On the other hand, in the present embodiment, all of the components of the conductive pattern portion 120 have a planar structure that is provided in a planar way only on the base surface 111a of the base 111. Moreover, the accumulating portion 121 of the conductive pattern portion 120 is formed into a shape corresponding to the planar shape of the information processor 10. That is, the inner peripheral edge of the accumulating portion 121 is just located or closely located on the outer peripheral edge of the information processor 10. Consequently, the accumulating portion 121 completely encloses the multi-touch display 12 with a fixed distance on the same plane or on the continuous plane. Accordingly, in the drive unit 110 of the first embodiment, the conductive pattern portion 120 may be formed in any planar pattern (by the printing or the like) on the base 111 corresponding to the facing surface of the multi-touch display 12 such that the accumulating portion 121 surrounds the facing surface. Thereby, unexpected functions and effects are obtained such that the production costs can be largely reduced and that the pattern of the conductive pattern portion 120 is diversified easily. That is, the accumulating portion 121 of the present embodiment receives and accumulates the charges flowing from the button 13X to the touching portion 123 in a sufficient amount to activate the same button 13X. Alternatively, the accumulating portion 121 changed the capacitance at the button 13X via the touching portion 123 by the charges accumulated beforehand in the accumulating portion 121 itself. Consequently, the accumulating portion 121 activates the button 13X for sure without any need to move the charges to the human body (i.e. without any need of an exposed conductive portion).

[Functions and Effects]

With the drive unit 110 of the first embodiment, the user grasps the information processor 10 by hand and matches the outer peripheral edge thereof to the outer peripheral edge of the shielding seal 125. Then, the multi-touch display 12 of the information processor 10 is closely located on the facing surface of the base 111 (center of the front surface of the shielding seal 125). Thereby, the touching portions 123 are electrostatically coupled with the selected buttons 13X of the multi-touch display 12 via the shielding seal 125. Thus, the charges at the buttons 13X flow from the touching portions 123 to the accumulating portion 121 via the connecting portions 122. At this time, in case the finger of the user is touched with the accumulating portion 121, the charges from the buttons 13X flow to the human body via the accumulating portion 121. Then, the buttons 13X are activated by the capacitive change, so that the information processor 10 generates a prescribed event to execute a predetermined information processing (typically a displaying process of contents). On the other hand, at this time, if the finger of the user is not touched with the accumulating portion 121, the charges from the buttons 13X flow into the accumulating portion 121 through the touching portions 123 and the connecting portions 122. Then, the charges are received and accumulated in the accumulating portion 121. Thus, as in the same manner as the case wherein the charges flow into the human body, the buttons 13X are activated by the capacitive change, so that the information processor 10 generates a prescribed event to execute a predetermined information processing.

Second Embodiment

As shown in FIG. 4, in an information processing system according to the second embodiment, the buttons 13 of the multi-touch display 12 of the information processor 10 are arrange into a matrix of four rows and five columns (20 buttons in total). A drive unit 120 has touching portions 123 of conductive pattern portion 120 located at positions corresponding to desired plural buttons 13X among the twenty buttons 13 (so as to be mirror symmetry therewith).

Third Embodiment

Figure 5:
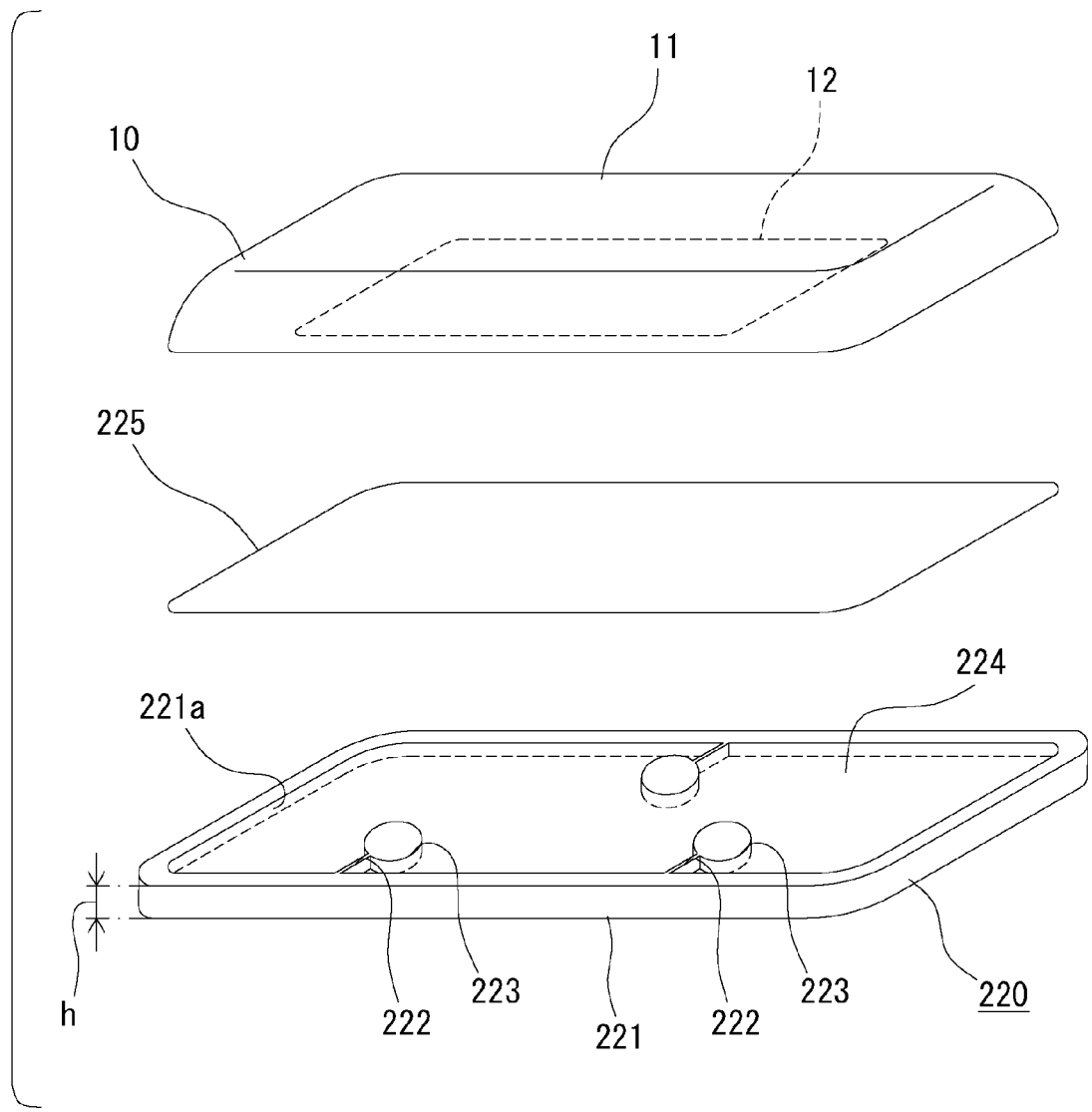
FIG. 5 is an exploded perspective view schematically showing the information processing device and a driving device of an information processing system according to a third embodiment of the invention, while peeling off a shielding sticker of the driving device to depict an interior structure of a conductive portion and so on of the driving device.

As shown in FIG. 5, an information processing system according to the third embodiment has substantially the same construction as the information processing system of the first embodiment. Still, a drive unit 220 has a conductive pattern portion 221-223 formed into a three-dimensional structure having a fixed thickness h. Moreover, a base 224 is made of a transparent synthetic resin into a flat plate shape having the thickness h that is filled at an inside of an inner peripheral edge 221a of the conductive pattern portion 221.

Fourth Embodiment

Figure 6:
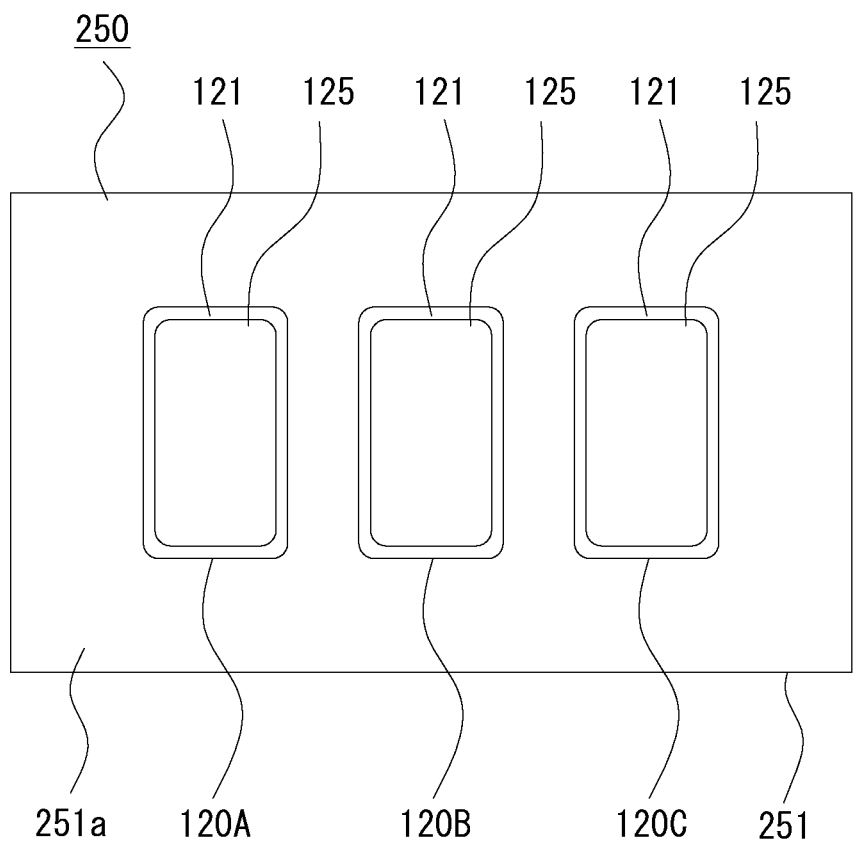
FIG. 6 is a plan view showing a driving device of an information processing system according to a fourth embodiment of the invention.

As shown in FIG. 6, in an information processing system according to the fourth embodiment, a drive unit 250 has conductive pattern portions 120A, 120B and 120C each of which is similar to the conductive pattern portion 120 of the drive unit 110 of the first embodiment. Still, the conductive pattern portions 120A, 120B and 120C are disposed in parallel with each other in plurality (three in total in the illustration) on a base surface 251a of a base 251. The base 251 has a size larger than (about three times as large as) the base 111. With the fourth embodiment of the information processing system, three conductive pattern portions 121A, 121B and 121C have different arrangement pattern of touching portions 123, respectively. Consequently, three kinds of information processing can be executed in the information processor by using a single drive unit 250.

Modifications of First to Fourth Embodiments

The base (111 or the like) of the first to the fourth embodiments may be formed into any desired shape such as a board shape or a block shape. Moreover, part of the base may be wider or narrower than the other part. Furthermore, the accumulating portion (121 or the like) may be shielded by a variety of sheet shaped shielding means (having a thickness and being made of a material that do not hinder the capacitance change) such as the shielding seal (125 or the like). Even in such case, the touching portions (123 or the like) are electro- statically coupled with the buttons 13X through the shielding means, thereby surely activating the buttons 13X. In addition, the accumulating portion (121 or the like) may be provided on a location other than the above-described location, e.g. at such an area or zone of the base 111 that a palm of the user naturally touches it in the above-described operation.

Moreover, the base (111 or the like) may have another surface (surface opposite to the base surface) formed into a curved surface or a deformed surface. Or the base may have the base surface such that only a surface part closely touched with the flat surface of the information processor is formed into a planar shape and such that the other surface part is formed into a surface shape other than the flat surface such as a curved surface. On the other hand, in case the surface of the multi-touch display of the information processor is a curved surface or the like, the base surface of the base is required to be a curved surface corresponding to such surface.

Fifth Embodiment

Figure 7:
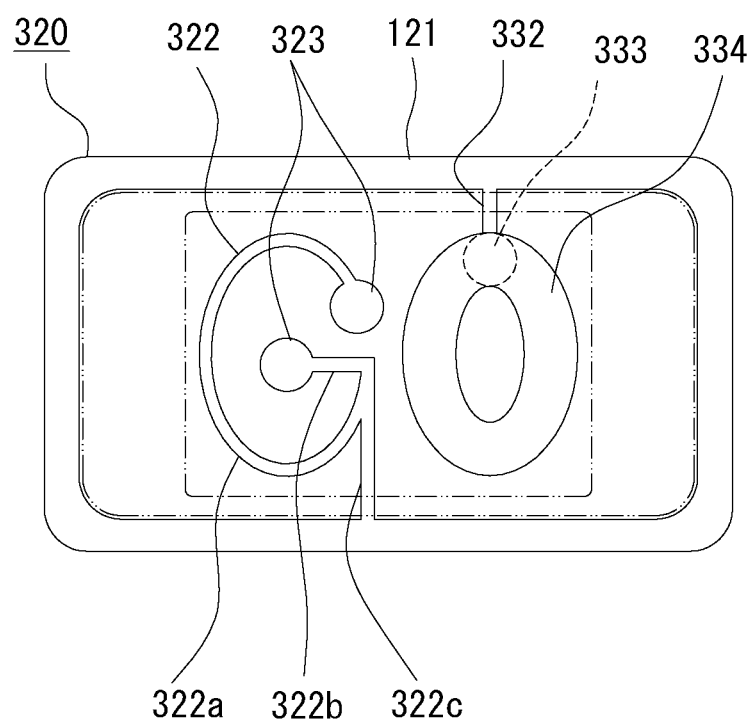
FIG. 7 is a plan view showing a driving device of an information processing system according to a fifth embodiment of the invention.

As shown in FIG. 7, an information processing system according to the fifth embodiment includes a drive unit 320 having substantially the same construction as the drive unit 120. On the other hand, the drive unit 320 has a conductive connecting portion 322 and a plurality of touching portions 322 that are formed on an inside facing surface of the accumulating portion 121. The connecting portion 322 and the touching portions 323 are constructed to represent a desired pattern shape such as a desired character, logo, symbol, graphic or figure. That is, the connecting portion and the touching portions of the invention may be provided as a desired pattern as long as they are disposed on the inside facing surface of the accumulating portion. Specifically, in the sixth embodiment, as one example of such pattern shape, the connecting portion 322 and the touching portions 323 are formed to draw each of characters "G" and "O" constituting a word "GO". That is, in the character "G", the touching portions 323 (two in number) have a circular shape and the connecting portion 322 is composed of three linear conductive connecting portions 322a, 322b and 322c.

On the other hand, in the character "O", a connecting portion 333 (one in number) is made of a conductive material and has a circular shape formed at a position corresponding to a desired touching area 13X of the multi-touch display 12 of the information processor 10. A conductive connecting portion 332 is made of a conductive body similar to the connecting portion 322 to couple the touching portion 333 with the accumulating portion 121 in a conductive manner. In the character "O", a linear portion except the touching portion 333 is defined by a coupling portion 334 having a curved line shape of the same width as a diameter of the touching portion 333. The coupling portion 334 is made of a non-conductive coating film such as a normal ink (non-conductive ink).

Sixth Embodiment

Figure 8:
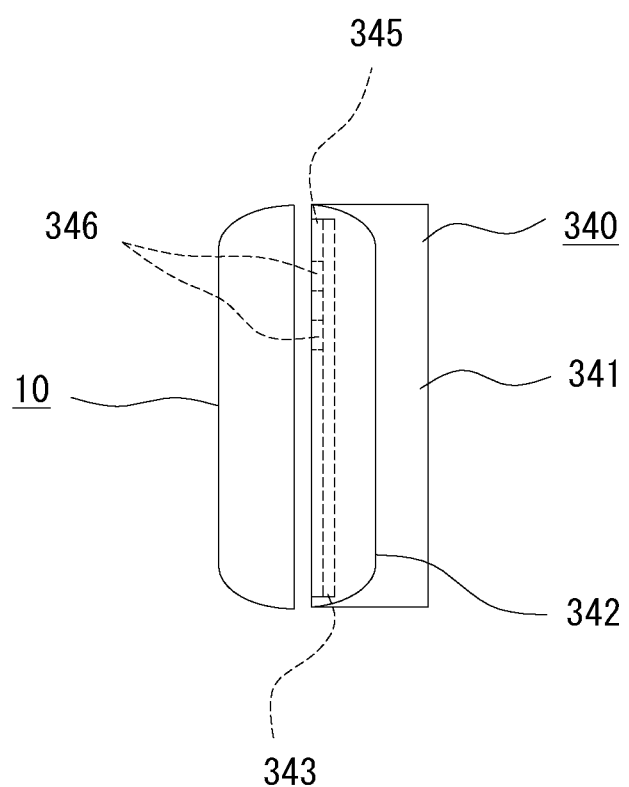
FIG. 8 is a side view showing a driving device and an information processing device of an information processing system according to a sixth embodiment of the invention.

As shown in FIG. 8, a drive unit 340 of an information processing system according to the sixth embodiment has a base 341 as an electrically insulating portion made of an insulating material. The base 341 is formed into a rectangular plate shape having an outline size and an outline shape nearly the same as the outline size and the outline shape of the information processor 10 so that a user can grasp the base 341. An exposed portion 342 is provided on one side surface (among four sides) of the base 341. The exposed portion 342 is made of an electrically conductive body to constitute a conductive exposed portion. An electrically charged portion 343 of flat plate shape is disposed at an inside of the base 341. The charged portion 343 is made of an insulating material or a dielectric material to constitute a charge accumulating portion. An insulating portion 345 of flat plate shape is made of an insulating material and disposed at the inside of the base 341. A plurality of touching portions 346 is embedded in the insulating portion 345. The touching portion 346 is made of a conductive body. The touching portions 346 are located at fixed positions (facing the touching areas 13X of the multi-touch display 12) on a facing surface of the base 341 (that faces the information processor 10). The front surface (outside or exposed surface) touching portion 346 is flush with the front surface (i.e. the facing surface) of the insulating portion 345. The touching portion 346 has a rear surface closely contacted with the charged portion 343 so that it is capable of giving and receiving the electric charges to and from the charged portion 343. The touching portion 346 is made conductive with the exposed portion 342 through a conductive connecting portion (not shown) that is made of a conductive body. The exposed portion 342 may be eliminated in the invention, since the touching areas 13X of the multi-touch display 12 can be surely activated by the touching portions 346 by giving and receiving the charges between the touching portions 346 and the charged portion 343. In this case, the connecting portion is unnecessary, accordingly. Moreover, the charged portion 343 is disposed at a location where it is closely contacted with the rear surface of the insulating portion 345 in the illustrated embodiment. However, the charged portion 343 may be disposed at a location more inside of the base 341, while being separated from the insulating portion 345. In this case, the charged portion 343 is conductively connected with the touching portions 346. Alternatively, the touching portion 346 is made into a shape extending to the charged portion 343 such a cylindrical shape so that the rear surface of the touching portion 346 is closely contacted with the charged portion 343.

Seventh Embodiment

As shown in FIG. 9, a drive unit 420 of an information processing system according to the seventh embodiment has a charge accumulating portion 121, conductive connecting portions 122 and touching portions 123. The accumulating portion 121, the connecting portions 122 and the touching portions 123 are made into a thin film shape by a conductive ink or the like used in the first embodiment. The drive unit 420 has a base 421 made of an insulating material. An exposed portion 422 is coated and formed on four sides of the base 421 to define a conductive body that is continuous and conductive to the accumulating portion 121.

Characteristic Features of the Invention

Each of the touching portions of the conductive pattern portion is formed to have an area larger than a minimum area required to activate the touching area of the multi-touch display by capacitive coupling when it comes in a touched or substantially touched condition with the touching area. On the other hand, the charged portion or the charge accumulating portion is formed to have an area larger than a minimum area required to activate the touching area of the multi-touch display by capacitive coupling through the transfer of the charges, via the connecting portion, to the charge accumulating portion, when the touching portion comes in a touched or substantially touched condition with the touching area. On the other hand, the connecting portion is provided on the base in such a manner as not to activate the touching area of the multi-touch display by capacitance coupling with the touching area. That is, in case the charged portion or the charge accumulating portion is disposed at the interior of the base, the connecting portion is disposed in an embedded manner at the interior of the base so that, even when the facing surface of the base comes in a touched or substantially touched state with the preset area (touching area) of the multi-touch display, the connecting portion is always kept at non-contacted state with the preset area Alternatively, in case the chare accumulating portion is disposed on the surface (at the same surface side as the facing surface) of the base, if the connecting portion comes into a touched or substantially a touched state with the touching area of the multi-touch display when the facing surface of the base comes into a touched or nearly touched state with the preset area of the multi-touch display, the connecting portion is formed such that the touched area or the nearly touched area thereof has an dimension smaller than a minimum detection area of the touching area of the multi-touch display.

As described above, the facing area of the touching portion itself of the conductive pattern portion is not able to move the electric charges in a sufficient amount required for changing the capacitance at the touching area of the multi-touch display when coming into touched or nearly touched state with the touching portion. Accordingly, the charge accumulating portion of a large area is electrically connected with the touching portion via the connecting portion to largely increase the capacitance as a whole by the charge accumulating portion. That is, it is necessary that the accumulating portion has an area larger than a minimum area that is able to receive and accumulate the charges in an amount required for capacitance change to activate the touching area when the touching portion comes into touched or nearly touched state with the touching area of the multi-touch display, even in a non-ground state. That is, the area of the accumulating portion must be not less than such area (minimum area for activation). Correctly, the facing surface of the touching portion has a fixed area though it is very small. Thus, the charge accumulating portion may have an area not less than an area obtained by subtracting the surface area of the touching portion from an actual required minimum area for activation.

The charge accumulating portion may be provided on a side or surface of the base that is different from the side or surface on which the touching portions are provided. In this case, the accumulating portion may be constructed as a flat surface body or a flat layered body provided on the plane that is parallel to the facing surface of the base in an embedded manner at the inside of the base. Alternatively, the accumulating portion may be constructed as a flat surface body or a flat layered body provided on the plane that crosses the facing surface of the base at a predetermined angle in an embedded manner at the inside of the base. Alternatively, the accumulating portion may be constructed as a three-dimensional flat plate shape (made of flat surface bodies or flat layered bodies extending along a plurality of planes) by combining these flat surface body or the flat layered body.

In place of the charge accumulating portion made of the conductive body, a charged portion made of a dielectric body may be disposed at the inside of the base so as to be electrically connected with the touching portions. Even in this case, it is possible to change the capacitance at the touching area of the multi-touch display to activate it by supplying the charges that are accumulated in the charged portion beforehand, when the touching portions are contacted with the touching areas. That is, the charge accumulating portion made of the conductive body of the first embodiment or the like serves to produce a capacitance change at the touching area of the multi-touch display so as to activate the touching area by receiving and accumulating the charges generated at the touching area via the touching portion and the connecting portion, when the touching portion comes into touched or nearly touched state with the touching area. By contrast, the charged portion made of the dielectric body serves to produce a capacitance change at the touching area of the multi-touch display so as to activate the touching area by moving the charges accumulated in itself to the touching area via the connecting portion and the touching portion, when the touching portion comes into touched or nearly touched state with the touching area. Alternatively, even if the charged portion is not charged or does not store the charges, it can be thought that the capacitance change is generated at the touching area so as to activate the touching area by moving the charges from the connecting portion and the touching portion to the touching area by use of charge transfer due to dielectric polarization or charge polarization.

With respect to the activation mechanism (charge transfer principle) of the touching area of the multi-touch display by the charge accumulating portion or the charged portion of the present invention, the inventors suppose that the above-described ones will apply. At any rate, the inventors confirmed that the touching area of the multi-touch display is stably activated for sure by the accumulating portion or the charged portion, even in case of not conducting the figure of the user with the touching portion by providing the exposed portion (i.e. in case the touching portion is not grounded via the human body).

Eighth Embodiment

Figure 10:
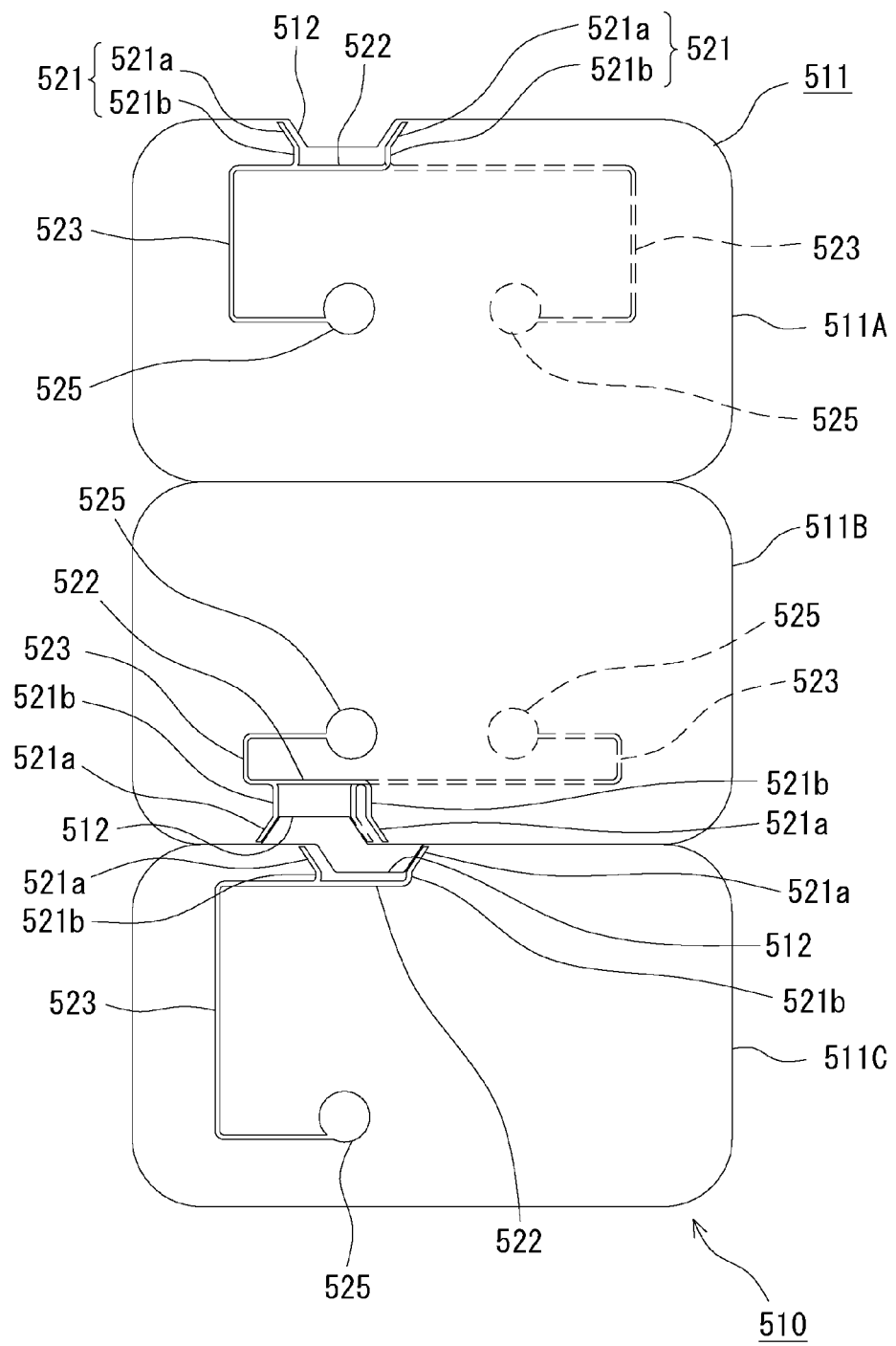
FIG. 10 is a plan view showing a front side of a driving device in an unfolded state of an information processing system according to an eighth embodiment of the invention.
Figure 11:
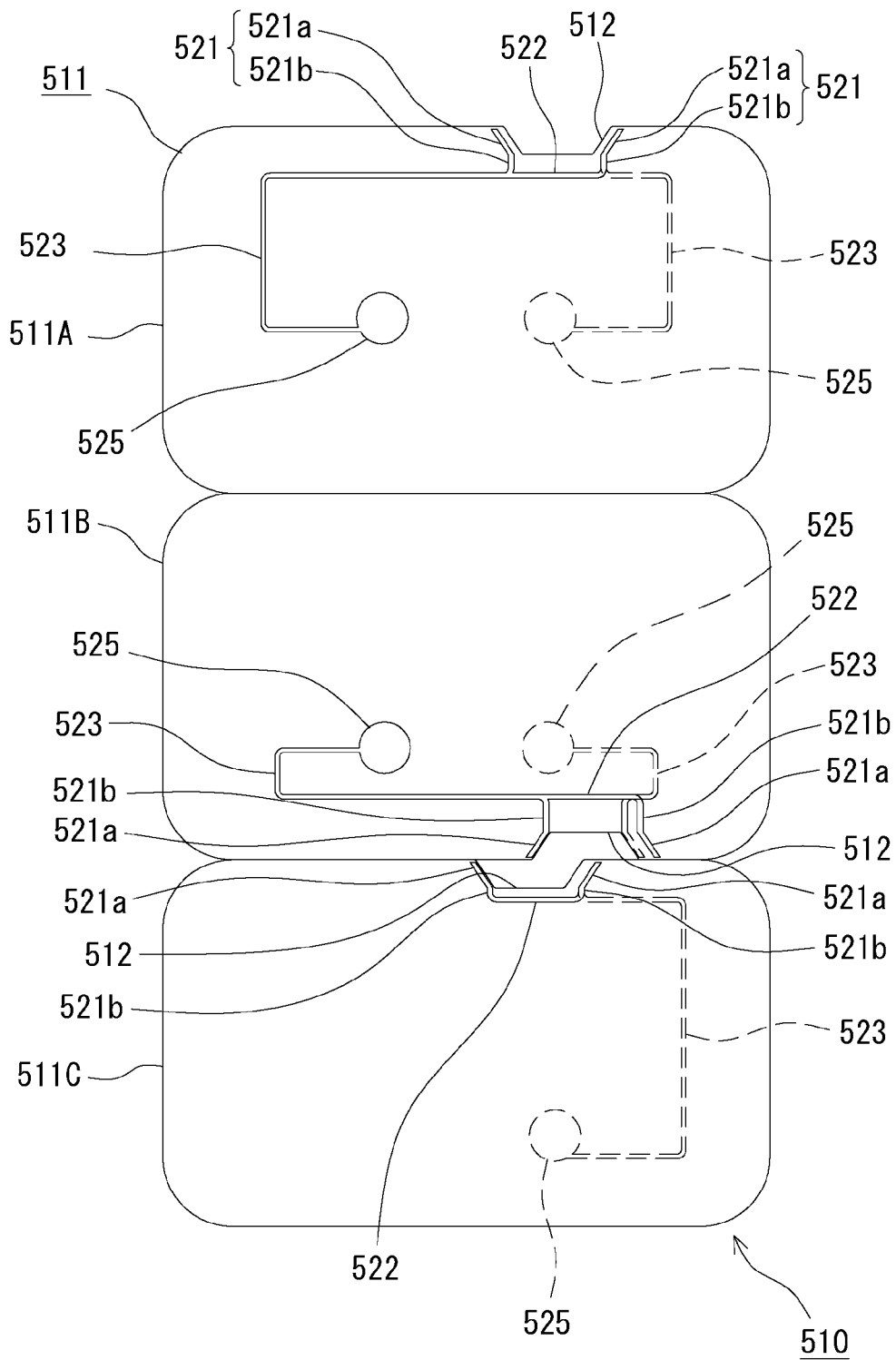
FIG. 11 is a plan view showing a rear side of the driving device in the unfolded state of the information processing system according to the eighth embodiment of the invention.
Figure 12:
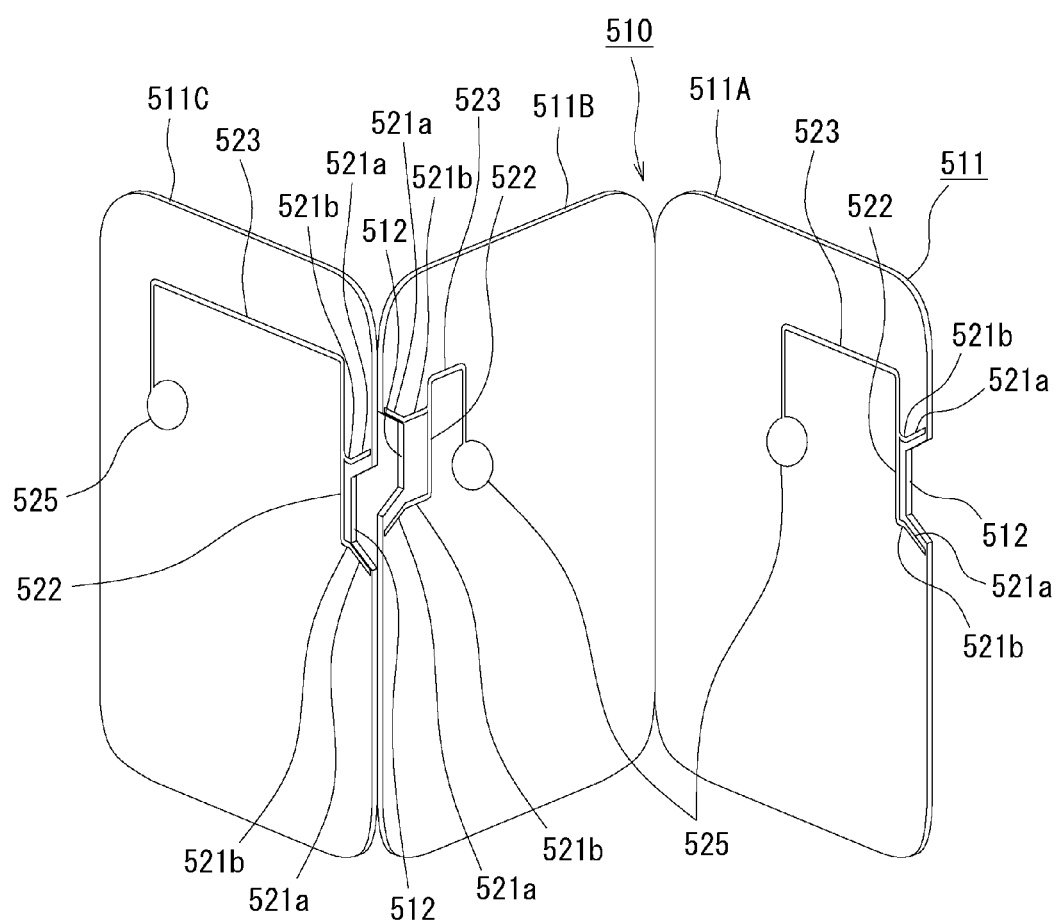
FIG. 12 is a perspective view showing the driving device, during being folded, of the information processing system according to the eighth embodiment of the invention.

As shown in FIG. 10 and FIG. 11, a drive unit 510 according to the eighth embodiment has a base 511 made of an insulating or dielectric flexible sheet such as a paper. The base 511 has a shape coupling three base sheets 511A, 511B and 511C of the same rectangular shape in a width direction thereof. The base sheets 511A, 511B and 511C are capable of being folded and overlapped on each other at their borders. Thus, the base 511 can be set into a three-fold state as shown in FIG. 12. Cutouts 512 of fixed trapezoidal shape are formed on an upper end of the base sheet 511A, a lower end of the base sheet 511B (border of the base sheet 511A and the base sheet 511B) and an upper end of the base sheet 511C (border of the base sheet 511B and the base sheet 511C), respectively. The cutouts 512 are formed at positions distant from the center toward the left of the base sheets 511A, 511B and 511C, respectively. The cutouts 512 of the base sheets 511A, 511B and 511C have substantially the same shape and dimension. On the other hand, as regards the position of the cutouts 512, the cutout 512 of the base sheet 511B is located at a first position that is the nearest from the left end of the base 511. The cutout 512 of the base sheet 511C is located at a second position that is the most far from the left end of the base 511 (position separated by about ½ of a length of the cutout 512 from the first position). The cutout 512 of the base sheet 511A is located at a third position that is the middle position between the first and the second positions (position separated by about ¼ of the length of the cutout 512 from the first position).

As shown in FIG. 10, conductive connecting portions 521, 522 and 523 and touching portions 525 are coated and formed as a predetermined electrical conductive pattern portion by a printing process of a conductive ink or the like on the surface of the base sheets 511A, 511B and 511C, respectively. The connecting portion 521, 522, 523 is made of a conductive coating film having a thin line shape. The touching portion 525 is made of a conductive coating film having a circular shape. The connecting portion 521 is composed of contact connecting portions 521a and non-contact connecting portion 521bs. The contact connecting portions 521a extend in an inclined manner at positions near and along a pair of inclined edges of the trapezoidal shape of the cutout 512, respectively, at the same inclination angle as the inclined edges. A leading end of the contact connecting portion 521a extends to the upper end or the border position of the base sheet 511A, 511B, 511C (i.e. to the leading end as an opening end of the cutout 512). On the other hand, a base end of the contact connecting portion 521a extends to a base end of the cutout 512. The non-contact connecting portion 521b extends from the base end of the contact connecting portion 521a to an inside of the base sheet 511A, 511B, 511C by a predetermined distance. The connecting portion 522 couples the base ends (lower ends) of two non-contact connecting portions 521b and the touching portion 525 so as to conduct them with each other. The connecting portion 523 couples the base end of each of the non-contact connecting portions 521b and the touching portion 525 so as to conduct them with each other. The touching portions 525 are located at every different positions on a front surface and a rear surface of each of the base sheets 511A, 511B and 511C, respectively. Thus, there are provided six modes or manners of arrangement of the touching portions 525 in total.

[Folded Mode]

Figure 13:
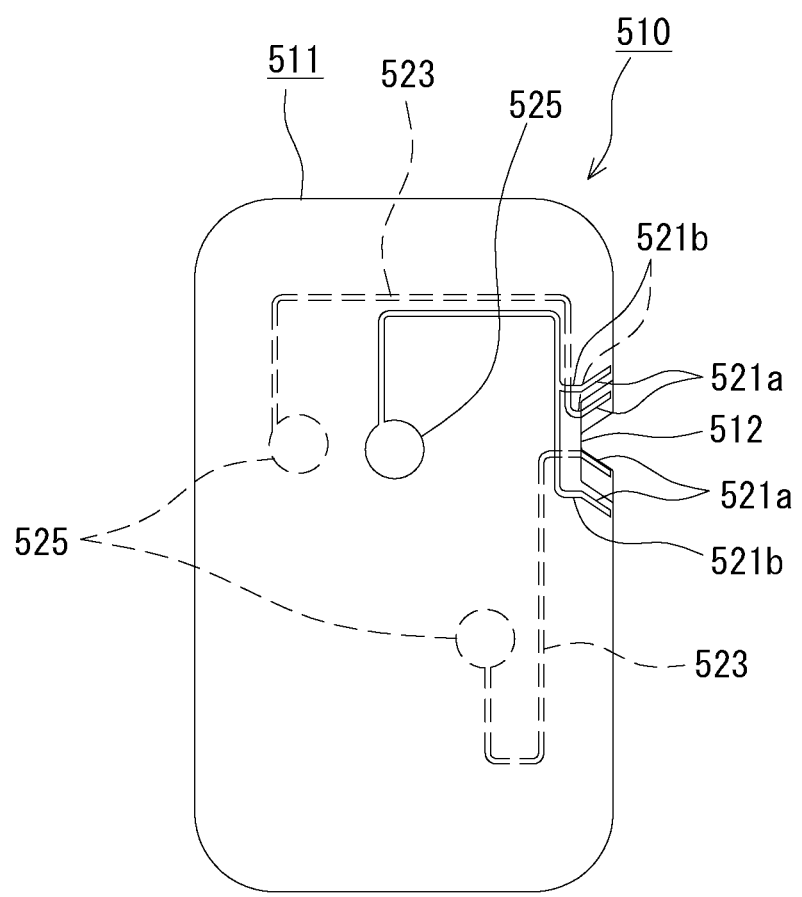
FIG. 13 is a plan view showing a front side of a first folded state of the driving device of the information processing system according to the eighth embodiment of the invention.
Figure 14:
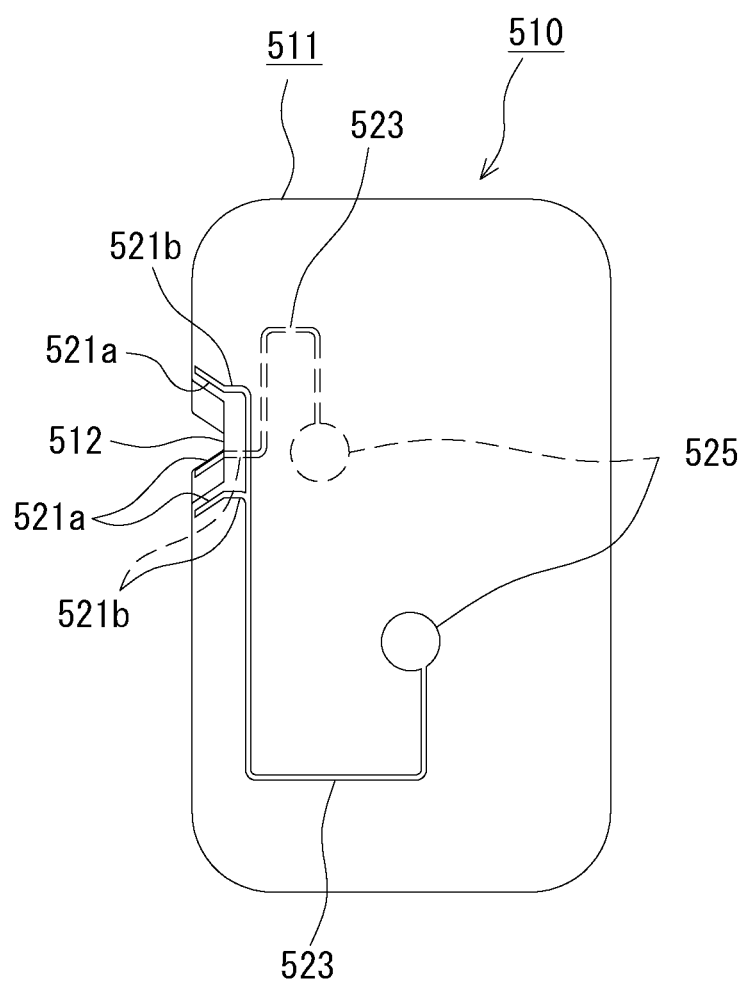
FIG. 14 is a plan view showing a rear side of a second folded state of the driving device of the information processing system according to the eighth embodiment of the invention.
Figure 15:
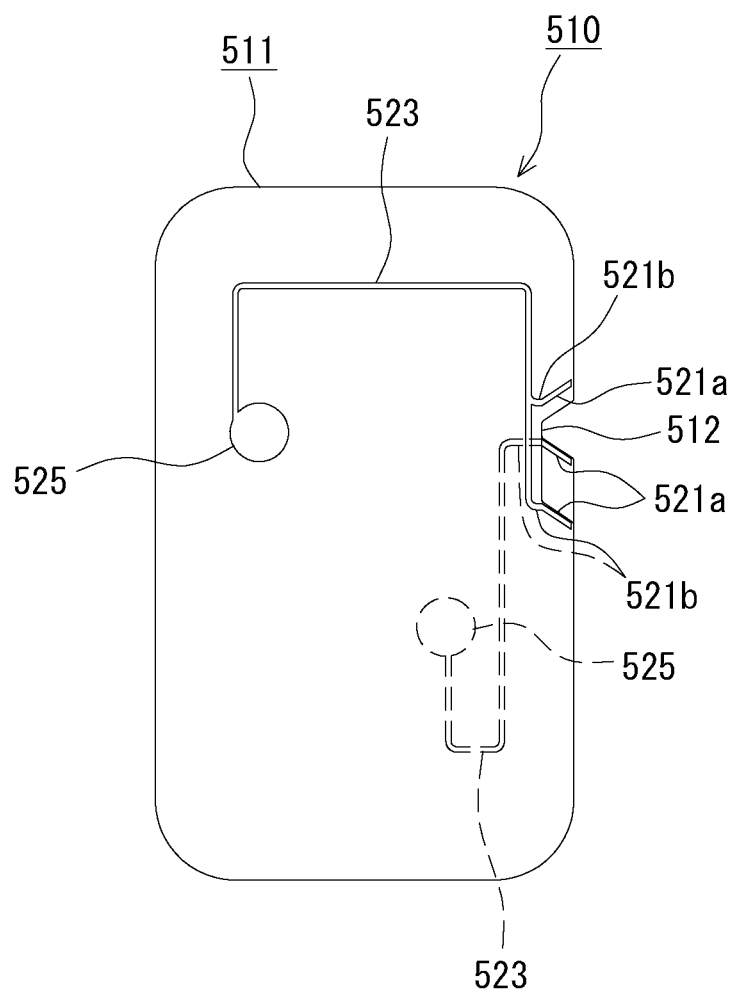
FIG. 15 is a plan view showing a front side of the second folded state of the driving device of the information processing system according to the eighth embodiment of the invention.

The three-fold mode of the base 510 includes a first folded mode shown in FIG. 13 and a second folded mode shown in FIG. 14 and FIG. 15. In the first folded mode, the rear surface of the base sheet 511A and the rear surface of the base sheet 511B are contacted with each other, while the front surface of the base sheet 511B and the front surface of the base sheet 511C being contacted with each other. In the second folded mode, the front surface of the base sheet 511A and the front surface of the base sheet 511B are contacted with each other, while the rear surface of the base sheet 511B and the rear surface of the base sheet 511C being contacted with each other. In the three-fold mode, the base sheets 511A, 511B and 511C come into a completely overlapped state on each other (except the cutouts 512). On the other hand, if the base sheet 511A is located at the uppermost layer in the first folded mode as shown in FIG. 13, part of the cutout 512 of the base sheet 511B at the middle layer is exposed from the cutout 512 of the base sheet 511A. At the same time, part of the cutout 512 of the base sheet 511C at the lowermost layer is exposed from the cutout 512 of the base sheet 511B.

At this time, an entirety of a pair of the contact connecting portions 521a located at the front side of the base sheet 511A is exposed. Moreover, one of the contact connecting portions 521a located at the rear side of the base sheet 511B is exposed through the cutout 512 of the base sheet 511A. Furthermore, one of the contact connecting portions 521a located at the front side of the base sheet 511C is exposed through the cutout 512 of the base sheet 511A and the cutout 512 of the base sheet 511B. Each of the base sheets 511A, 511B and 511C has an outline corresponding to the outline of the information processor 10 and a dimension slightly larger than the information processor 10. Particularly, a width of the base sheets 511A-511C in the folded state is set larger than the information processor 10 at least by the width of the cutout 512 or more.

[How to Use]

In use, the user makes the drive unit 510 into the first folded state and grasps the information processor 10 by hand to press it to the front surface of the base sheet 511A, while putting the front side of the base sheet 511A upward. At this time, the drive unit 510 is located such that the cutouts 512 are located at the right hand (i.e. making it into the state of FIG. 13), for example. Then, the left end of the information processor 10 is matched to the left end of the base 510 in the folded state. Thereby, the right side portion of the base 510 is exposed from the right end of the pressed information processor 10 by a dimension of the width of the cutout 512 or more. Thereafter, the finger (index finger or the like) of the user grasping the information processor 10 comes into touched or nearly touched state with the contact connecting portions 521*a* in the exposed state. Accordingly, the finger of the user is conducted with three points of the touching portions 525: the touching portion 525 at the front side of the base sheet 511A that is conductively connected with the contact connecting portions 521*a* in the exposed state, the touching portion 525 at the rear side of the base sheet 511B that is conductively connected with the contact connecting portions 521*a* in the exposed state, and the touching portion 525 at the front side of the base sheet 511C that is conductively connected with the contact connecting portions 521*a* in the exposed state. On the other hand, at this time, three touching portions 525 face corresponding three touching areas 13X of the multi-touch display 12 of the information processor 10. Accordingly, the capacitance changes at the three points of the touching areas 13X, so that the information processor 10 executes a prescribed operation.

In the same way, the user makes the drive unit 510 into the second folded state and presses the information processor 10 to the rear surface of the base sheet 511A, while putting the rear side of the base sheet 511A upward and directing the cutout 512 to the left hand. (i.e. into the state of FIG. 14). Then, the finger of the user comes into touched or nearly touched state with the contact connecting portions 521 in the exposed state. At this time, no touching portions 525 are provided on the rear surface of the base sheet 511B. Therefore, the finger of the user is conducted with two points of the touching portions 525: the touching portion 525 at the rear side of the base sheet 511A that is conductively connected with the contact connecting portions 521*a* in the exposed state and the touching portion 525 at the front side of the base sheet 511B that is conductively connected with the contact connecting portions 521*a* in the exposed state. Accordingly, the capacitance changes at the two points of the touching areas 13X facing the two points of the touching portions 525, so that the information processor 10 executes a prescribed operation.

In the same way, the user makes the drive unit 510 into the second folded state and presses the information processor 10 to the front surface of the base sheet 511C, while putting the front side of the base sheet 511C upward and directing the cutout 512 to the right hand. (i.e. into the state of FIG. 15). Then, the finger of the user comes into touched or nearly touched state with the contact connecting portions 521 in the exposed state. At this time, though the touching portions 525 are provided on the front surface of the base sheet 511A, the contact connecting portions 521*a* thereof are not exposed from the cutouts 512 and the finger is never touched therewith. Therefore, the finger of the user is conducted with two points of the touching portions 525: the touching portion 525 at the front side of the base sheet 511C that is conductively connected with the contact connecting portions 521*a* in the exposed state and the touching portion 525 at the rear side of the base sheet 511B that is conductively connected with the contact connecting portions 521*a* in the exposed state. Accordingly, the capacitance changes at the two points of the touching areas 13X facing the two points of the touching portions 525, so that the information processor 10 executes a prescribed operation.

As described above, the drive unit 510 is capable of being set into the first folded mode (state in FIG. 13), the one state of the second folded mode (state in FIG. 14) or the other state of the second folded mode (state in FIG. 15). Thus, it is possible to cause the information processor to execute different operations by three arrangement patterns of the touching portions 525 at a maximum by using a single drive unit 510. The base may be modified into other structure such that it consists of two base sheets or four or more base sheets, as long as a predetermined touching portions 525 are capable of activating the touching areas 13X of the multi-touch display 12. Moreover, the positions of the touching portions 525 may be any desired positions. The touching portions 525 may be provided on the front surface and/or the rear surface of each of the base sheets.

Ninth Embodiment

Figure 16A:
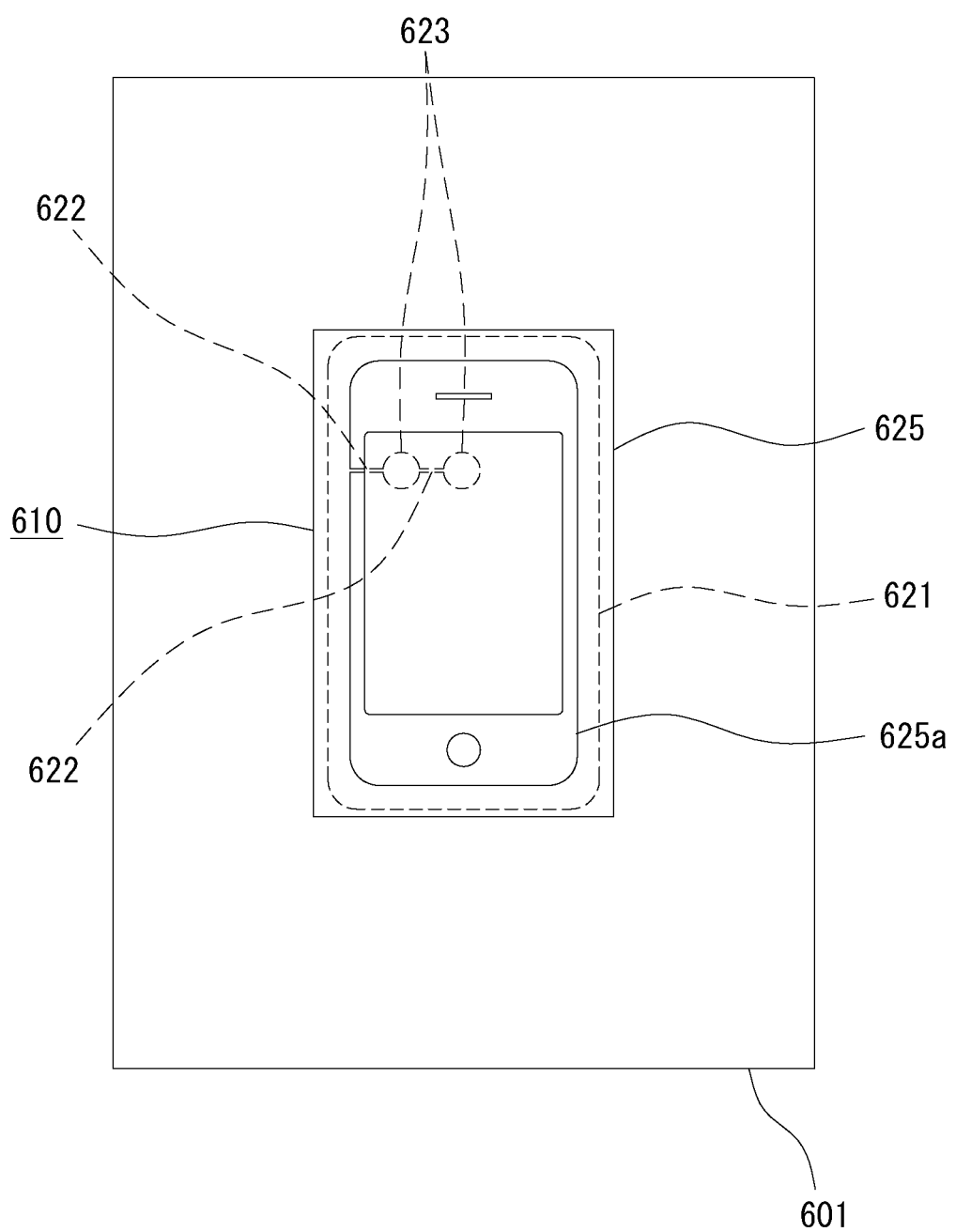
FIG. 16A is a plan view showing a driving device of an information processing system according to a ninth embodiment of the invention.

As shown in FIG. 16A and FIG. 16B, a drive unit 610 of the ninth embodiment is stuck on a surface of a paper such as a brochure or a catalog by sticking or the like. In detail, as shown by the enlarged cross-sectional view of FIG. 16B, the drive unit 610 has a base 611 made of an electrically insulating or dielectric flexible sheet such as a paper. A conductive pattern portion is formed on the front surface of the base 611. The conductive pattern portion is a coating film similar to the conductive pattern portion 120 of the first embodiment. Specifically, a charge accumulating portion 621 is formed along an outer peripheral edge of the base 611 at an inside position of the base 611 with a fixed distance to the outer peripheral edge. The accumulating portion 621 is a coating film having a frame shape corresponding to the outer periphery of the base 611. Conductive connecting portions 622 and touching portions 623 are formed at an inside area of the base 611 in relation to the accumulating portion 621. The connecting portion is a coating film of a thin linear shape. The touching portion is a coating film of a circular shape. The touching portions 623 are disposed in a predetermined arrangement manner. Each of the touching portions 623 is conducted with the accumulating portion 621 via the connecting portion 622. A shielding seal 625 of a sheet shape is stuck and adheres to the base 621 by pressure bonding or the like. The shielding seal 625 covers the conductive pattern portion 621-623 as a whole. That is, the drive unit 610 is formed into one sheet by sticking the shielding seal 625 after forming a predetermined conductive pattern portion on the base 611. Then the drive unit 625 is stuck to a fixed location of an object such as a desired brochure, catalog, panel, wall or the like.

Tenth Embodiment

Structure of Drive Unit

Figure 17:
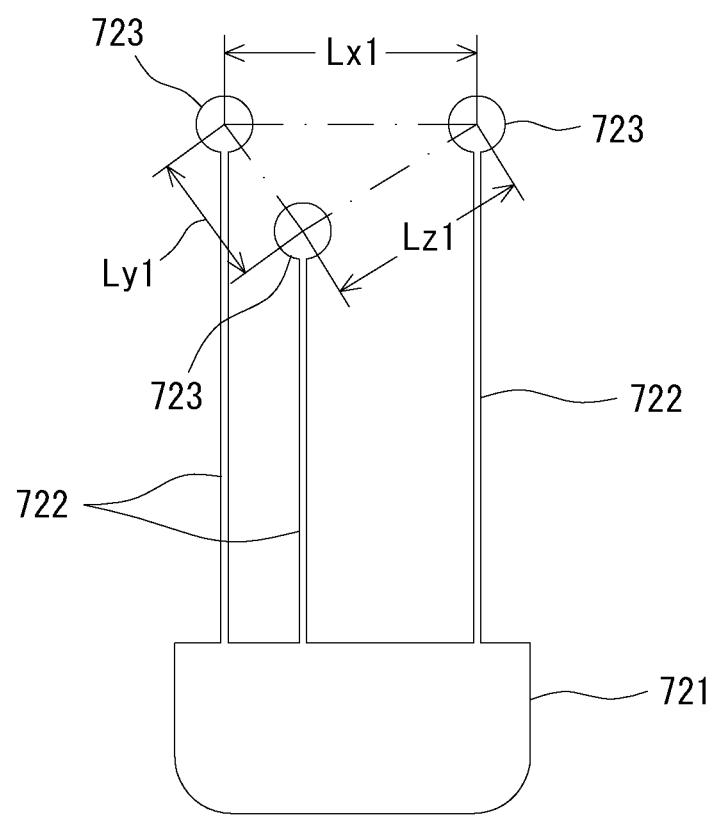
FIG. 17 is a plan view showing a first example of a conductive pattern portion of a driving device of an information processing system according to a tenth embodiment of the invention.
Figure 18:
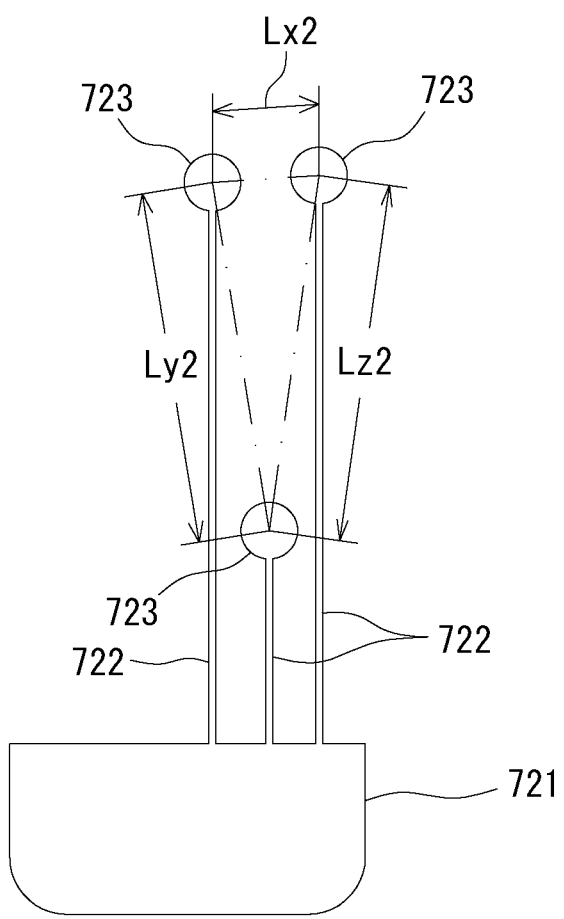
FIG. 18 is a plan view showing a second example of a conductive pattern portion of the driving device of the information processing system according to the tenth embodiment of the invention.

As shown in FIG. 17 and FIG. 18, a drive unit used in the tenth embodiment of information processing system has a predetermined conductive pattern portion 721, 722, 723 formed on a front surface of a base (not shown) similar to the base of the above embodiments. In detail, a charge accumulating portion 721 is formed into a coating film of a fixed planar shape having an area not less than the minimum area for activation. Each of conductive connecting portions 722 is formed into a coating film having a thin linear shape. Each of touching portions 723 is formed into a coating film having a circular shape. The touching portions 723 are disposed in a predetermined arrangement manner on a fixed location. The touching portion 723 is conducted with the accumulating portion 721 via the connecting portion 722.

In the tenth embodiment, the information processor 10 does not preset the touching areas 13 preliminarily. Accordingly, the touching portions in the drive unit are not disposed in an arrangement corresponding to the preset combination of touching areas (buttons) 13X of the multi-touch display 12. On the contrary, in the tenth embodiment, the information processing system utilizes a predetermined judging program to judge a polygonal shape (desired polygon such as triangle or rectangle or the like though FIG. 17 and FIG. 18 exemplify a triangle) that is uniquely determined by the number and arrangement of the touching portions 723. Then, the information processing system causes the information processor 10 to execute a corresponding process. In detail, in the example shown in FIG. 17, three touching portions 723 are dispose in a first fixed arrangement on the front surface of the base. Distances Lx1, Ly1, Lz1 between centers of the three touching portions 723 (i.e. lengths of three imaginary lines connecting three touching portions 723) increase or decrease in accordance with the relative positions of the three touching portions 723 in the fixed arrangement. If the relative positions of the three touching portions 723 are determined, the distances Lx1, Ly1, Lz1 are uniquely determined, too. In the same manner, in the example shown in FIG. 18, three touching portions 723 are dispose in a second fixed arrangement on the front surface of the base. If the relative positions of the three touching portions 723 are determined, the distances Lx2, Ly2, Lz2 between centers of the three touching portions 723 are uniquely determined, in the same way as the example in FIG. 17. The polygon may be other than the triangle, e.g. a convex polygon such as a rectangle (including non-regular polygons in addition regular polygons) that is known as a shape of common polygon. Moreover, the polygon may be a concave polygon (non-convex polygon) such as a star shape.

[Congruency Judging Program]

As the judging program, a congruency judging program is used to judge congruent figures. In detail, a plurality of conductive pattern portions having different contours or outlines is prepared as the conductive pattern portion of the drive unit. For example, as the outline shape of the conductive pattern portion, there is prepared a polygon shape as a two-dimensional figure that is obtained by connecting the touching portions constituting the conductive pattern portion. On the other hand, the outlines of all the conductive pattern portions that have been prepared beforehand or that will be used aftertime are defined and stored in a predetermined storage means or memory area (acting as shape storage means) that is composed of a predetermined database of a predetermined file. For example, in case of the polygon, each of the outlines of the conductive pattern portions is determined depending on the relative positions of the touching portions of each of the conductive pattern portions. That is, the two-dimensional figure as the outline of the conductive pattern portion is uniquely determined by the combination of the lengths (distances between vertices) of the sides constituting the figure and the angles at respective vertices. Accordingly, each combination of the lengths of sides and the angles at vertices is stored in the predetermined shape storage means.

When the conductive pattern portion of the drive unit is pressed to the multi-touch display, the touching portions of the conductive pattern portion are detected. Then, the information processing system acquires respective touching coordinate positions of the detected touching portions (e.g. three touching portions 723), thereby computing a coordinate of each of the touching positions on the basis of the touching coordinate positions. In general, the information processor 10 uses a predetermined coordinate system (e.g. pixel coordinate system, Cartesian coordinate system, matrix coordinate system) that is preset on the multi-touch display 12. Then, the information processor 10 specifies a coordinate range of the area on which the finger touches by a fixed touch detection step, thereby outputting a specific coordinate position (x coordinate and y coordinate) within the coordinate range of such touched area on the display. For example, if three touching portions 723 of the conductive pattern portion of FIG. 17 or FIG. 18 are pressed to the multi-touch display 12, the information processor 10 outputs a specific coordinate information (x coordinate and y coordinate) within a touched area of each touching portion 723 as an information representing the coordinate of the touching point.

Figure 19:
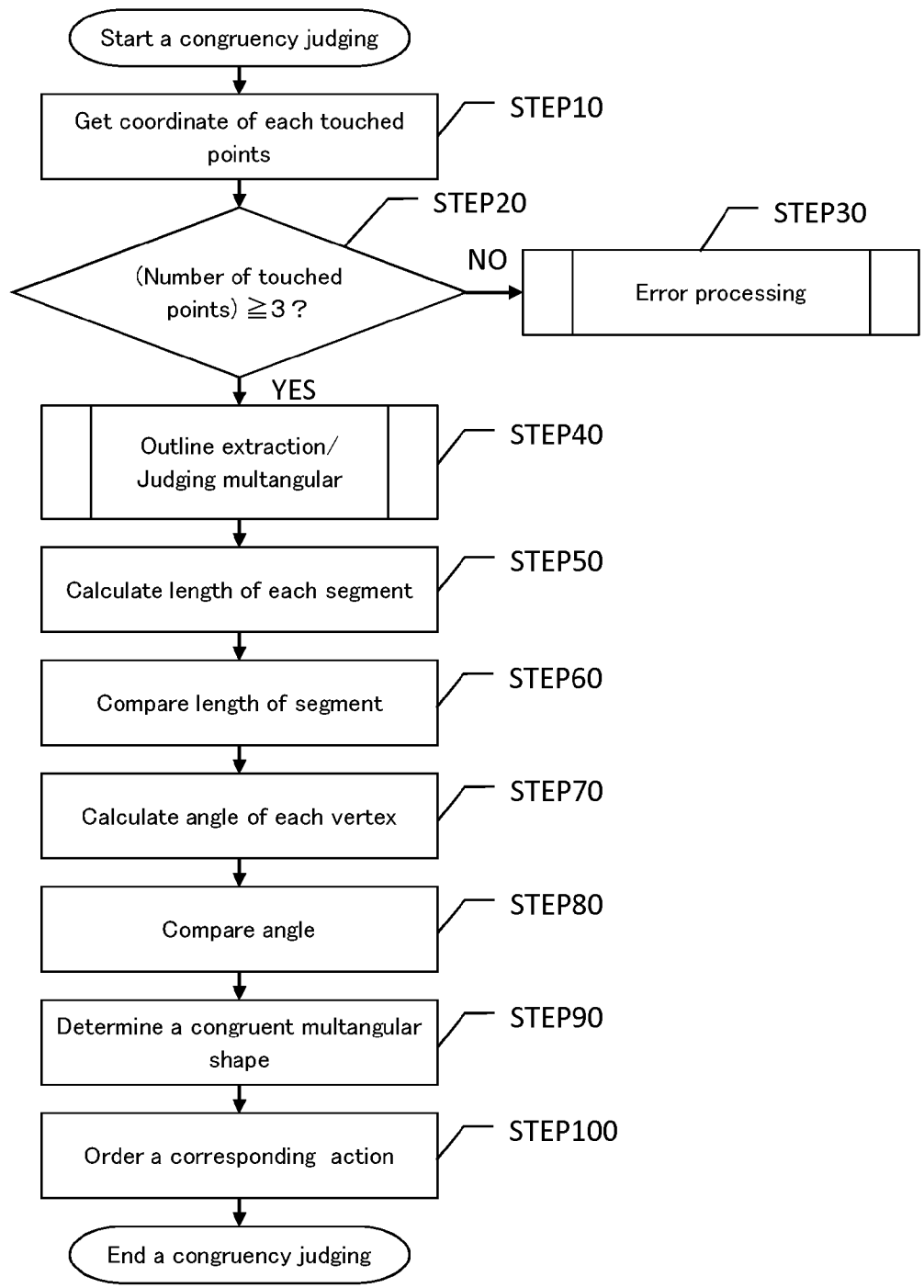
FIG. 19 is a flowchart showing a congruency judging program of the information processing system according to the tenth embodiment of the invention.

As shown in FIG. 19, the congruency judging program acquires and computes the coordinate information of each touching point as described above in STEP 10. Then, it is judged if the number of touching points is not less than three (i.e. a polygon can be defined or not) in STEP 20. In case the number of points is two or less, an error processing is executed in STEP 30. On the other hand, in case the number of touching points is three or more, an outline of a polygon obtained by connecting the touching points is extracted and its polygon shape is determined in STEP 40. At this time, if the polygon is a convex polygon, for example, the shape of the polygon is determined by use of known convex hull algorithm. If the polygon is a concave polygon, for example, the shape of the polygon is determined by use of known concave hull algorithm. After acquiring the outline of the polygon, a length of each of sides of the polygon is computed from a side to a next continuous side in turn up to the last side in STEP 50. The computed length of each side is compared with a length of each side of a polygon stored in the shape storage means in STEP 60. Moreover, an angle (normally an internal angle) at each of vertices of the polygon is computed from an vertex to a next adjacent vertex in turn up to the last vertex in STEP 70. The computed angle at each vertex is compared with an angle at each vertex of a polygon stored in the shape storage means in STEP 80. Then, there is determined a polygon that has the same lengths of corresponding sides and the same angles at the corresponding vertices as the polygon formed by the detected touching portions in STEP 90, on the basis of the comparison result in STEPs 50, 60, 70 and 80. Thereafter, a predetermined operation command related to the determined polygon shape is outputted to an information processing device (typically a mobile terminal having a multi-touch display) as a operating object in STEP 100. On the basis of the operation command, the information processing device executes a corresponding process.

[Example of Congruency Judging Program]

An example of the above-mentioned congruency judging program is explained referring to FIG. 20. As shown in FIG. 20, the congruency judging program uses a triangle as one example of the polygon. A shape of the triangle is uniquely determined if lengths of three side are determined. Thus, the congruency judging processing is carried out easily as compared with the other polygons. For example, there is supposed a triangle consisting of a side x (length Lx), a side y (length Ly) and a side y (length Lz) wherein Lx>Ly>Lz. If the length Lx, Ly, Lz of each side is determined, the outline shape of the triangle is uniquely determined. Therefore, the shape storage means stores information of each of combinations of lengths of three sides constituting each of the triangles. Specifically, among the three sides x, y and z of the triangle, the side x having the largest length is defined as a first side, the side y having the middle length is defined as a second side, and the side z having the smallest length is defined as a third side. Then, the length Lx of the first side x, the length Ly of the second side y and the length Lz of the third side z are stored in a separately prepared file or database, respectively. For example, as shown in FIG. 20, the length Lx of the side x (x1-x6) is set from 9 cm to 4 cm at 1 cm interval and is stored in a side length storage means prepared for the side x. The length Ly of the side y (y1-y6) is set from 8 cm to 3 cm at 1 cm interval and is stored in a side length storage means prepared for the side y. The length Lz of the side z (z1-z6) is set from 7 cm to 2 cm at 1 cm interval and is stored in a side length storage means prepared for the side z. On the other hand, each of combinations of these three sides x, y and z is stored in a side combination storage means. Here, the storage means stores only combinations having the lengths of the sides such that Lx>Ly>Lz. Then, suppose that the lengths of the sides obtained on the basis of the coordinate information of the touching points of three touching portions 723 is such that Lx=7 cm, Ly=6 cm and Lz=3 cm. In this case, a side combination information (cm) corresponding to such combination is extracted on the basis of a key information (x3, y3, z5) representing the lengths of the sides, Thereby, there is outputted a predetermined operation command that has been related to such side combination information.

The above-described length of side or combination of sides is only an example. The length of side or combination of sides may be obtained by any other possible settings. For example, an isosceles triangle or an equilateral triangle may be used as the triangle used in the system other than a triangle having different lengths of three sides (inequilateral triangle). Moreover, the length of the side is represented by a unit of centimeter only for convenience sake in the above description. The length of the side may be represented by a proper pixel dimension that is determined depending on a resolution (maximum longitudinal pixel number*maximum lateral pixel number) of the multi-touch display. At any rate, in the above tenth embodiment, there is prepared a plurality of drive units that includes conductive pattern portions having different arrangement of three touching portions 723 so as to constitute a triangle corresponding to the combinations of the sides.

[Error Allowance Processing]

In general, some error (e.g. about 5 pixel of detection error) may be inherent or unavoidable in a multi-touch display between an actual touching position and a coordinate position of a touching point outputted in a detection process of the touching point. Therefore, in the congruency judging program, it is desirable to provide an allowance range by an amount of detection error of the touching point that is proper to the multi-touch display so as to judge the length of the side of the polygon. For example, in case the detection error is 5 pixel, the touching points at opposite ends of each of the computed side length Lx, Ly, Lz may differ by 5 pixel from each of the actual touching points. For instance, the length Lx, Ly, Lz may become larger or smaller by 10 pixel in total. Therefore, it is desirable that, even if the computed side length Lx, Ly, Lz does not correctly matches with the side length stored in the shape storage means, when the difference is within a twice or less (e.g. within a range of plus or minus 10 pixel if the detection error is 5 pixel) of the detection error in relation to the stored side length, such difference is accepted as an allowance range, thereby judging that the computing side length is equal to the stored side length. In this case, it is preferable to set the side length of the triangle at a length that is much larger than the detection error by a certain amount (e.g. twice of more of the allowance range).

[Web Service]

The tenth embodiment may be concretized into a remote service such as a web service. For example, a predetermined memory area of a remote server such as a web server stores the above-described congruency judging program and the side length information and other information that are used in the congruency judging program. On the other hand, a user interface (specific web page or the like) is prepared so as to produce an event for executing the congruency judging program via a network. Then, when a user presses the conductive pattern portion of the drive unit on a multi-touch display, an information representing the sides and angles of the polygon outputted by the multi-touch display is transmitted to the remote server via the network. Thereafter, the remote server carrying out the processing of the congruency judging program in the same manner as described above, thereby executing a predetermined operation.

[Ticket-type Drive Unit]

The present invention may be embodied as follows. Specifically, a base is formed into a sheet shape having a smaller area and a smaller outline shape than the multi-touch display 12. A charge accumulating portion is formed on part of the base (e.g. only lower part of the front surface thereof). Conductive connecting portions and touching portions are formed on the other part of the base (e.g. middle part and upper part of the front surface thereof). That is, the tenth embodiment of drive unit may be a drive unit including of a ticket shape (ticket-type) that has the base formed into a smaller outline shape than the outline shape of the multi-touch display, for instance. Specifically, the conductive pattern portion shown in FIG. 17 or FIG. 18 is printed on a piece of sheet having a ticket shape (e.g. small rectangular sheet shape). In this case, the user grasps the part of the accumulating portion 721 that is located at one end portion (e.g. in the longitudinal direction) of the base. Then, the user presses the other part (particularly the part of the touching portions 723) of the base or drive unit to the multi-touch display. Thereby, the finger of the user naturally or spontaneously touches the accumulating portion 721 of the large dimensional area so as to realize a grounding or earth connection. Thus, it is possible to cause the information processor to surely execute a desired operation according to the positions of the touching portions 723. In this case, contrary to the tenth embodiment, no charge accumulation is necessary by the accumulating portion 721 itself. Therefore, it is possible to provide a planar shape of conductive body layer, which is composed of a similar coating to that of the accumulating portion 721, on one end portion of the sheet only at a location where the finger of the user naturally touches and by a minimum area. On the other hand, if the accumulating portion 721 as described in the tenth embodiment is provided, the information processor can be driven without making the finger touch with the conductive pattern portion.

[Shape of Charge Accumulating Portion]

The driving device of the tenth embodiment may have a charge accumulating portion formed into an annular or colloidal shape, while providing a conductive patter portion composed of the touching portions and the connecting portions at an inside of the circular ring. In this case, the drive unit may be used in any posture. That is, if the conductive pattern portion is pressed to the multi-touch display in any inclined state at any angle in a planar direction, the multi-touch display is able to recognize the touching positions of the touching portions.

[Electrical Insulation at Back Side of Drive Unit of Sheet Type]

In the present invention (e.g. in the ninth embodiment), the driving device may be a sheet type drive unit that is stuck to a desired location of an outside surface an object (brochure or the like) by bonding or the like. In this case, if a conductor like a metal exists at the back of the drive unit, the multi-touch display possibly malfunctions due to such backside conductor. Accordingly, in such case, it is desirable to interpose an electrically insulating body between the rear side of the conductive pattern portion of the drive unit and the outside surface of the object, thereby assuring electrical insulation between the conductive pattern portion and the backside conductor.

[Maximum Width of Conductive Connecting Portion]

In the present invention, the width of the connecting portion is set at a dimension less than a minimum dimension at which the multi-touch display is capable of reacting. Here, the inventors confirmed by verification tests that, if the width of the connecting portion is about 1 mm or more, common multi-touch display of mobile information processing terminal (e.g. smart phone) electrostatically reacts with the connecting portion and recognizes it as a touching point. Accordingly, it is preferable to set the width of the connecting portion at a value less than about 1 mm, though it depends on a threshold of the capacitance range in the capacitive reaction of the multi-touch display. Moreover, in case the conductive pattern portion is made of the conductive ink, it is desirable to make the width of the connecting portion as small as possible in order to reduce the amount of use of the conductive ink. Furthermore, the inventors confirmed by verification tests that, in case of forming the conductive pattern portion by printing, it improves the detection accuracy of the multi-touch display if the conductive pattern portion is formed by a silk screen printing using a mesh of 350 or more. Therefore, it is desirable to form the conductive pattern portion by the silk screen printing of 350 meshes or more.

The preferred embodiments described herein are illustrative and not restrictive, the scope of the invention being indicated in the appended claims and all variations which come within the meaning of the claims are intended to be embraced therein.

What is claimed is:

1. A driving device adapted to be connected to an information processing device having a capacitive multi-touch display, comprising:
    a base made of an electrically insulating body; and
    a conductive pattern portion disposed at one side surface of the base;
    wherein the driving device serves to cause the information processing device to execute a proper action when the driving device is touched with the multi-touch display;
    wherein the conductive pattern portion has a finger touch portion, a conductive connecting portion and a plurality of touching portions;
    wherein each of the touching portions is made of an electrically conductive body having a touching area of a predetermined dimension that comes into a touched or nearly touched state with the multi-touch display;
    wherein the finger touch portion is made of a planar shape of conductive body layer provided on one end portion of the base;
    wherein the conductive connecting portion is made of an electrically conductive body electrically connecting the finger touch portion and each of the touching portions;
    wherein the touching area of each of the touching portions is set at a value not less than a minimum detection area of the multi-touch display;
    wherein the conductive connecting portion is provided on the base so as to be kept from activating a touching area of the multi-touch display by a capacitive coupling between the touching area of the multi-touch display and itself; and
    wherein the finger touch portion is provided on the one end portion of the base only at a predetermined location where a finger of a user naturally touches.

2. A driving device according to claim 1, wherein the finger touch portion is provided at the predetermined location on the one end portion of the base by a minimum area.

3. A driving device according to claim 1, wherein the connecting portion has a width less than 1 mm.

4. A driving device according to claim 1, wherein the conductive pattern portion is formed on the one side surface of the base by a silk screen printing of 350 meshes or more.

5. A driving device according to claim 1, further comprising a shielding member shielding the conductive pattern portion on the one side surface of the base, wherein the shielding member has a thickness and is made of a material that do not hinder a capacitance change by the touching portion so that the touching portion changes the capacitance of the multi-touch display through the shielding member.

6. A driving device according to claim 1,
    wherein the base has a plurality of base sheets of a same rectangular shape, the base sheet having a shape coupling the plurality of base sheets in a width direction thereof so that the base sheets are capable of being folded and overlapped on each other,
    wherein the base sheets have cutouts at one ends thereof, respectively,
    wherein the conductive pattern portion has the conductive connecting portion and the touching portions formed on one side surfaces of the base sheets, respectively,
    wherein the conductive connecting portion is composed of a contact connecting portion and non-contact connecting portion,
    wherein the contact connecting portion extend at a position near and along an edge of the cutout to constitute the finger touch portion, a leading end of the contact connecting portion extends to the one end of the base sheet, while a base end of the contact connecting portion extends to a base end of the base sheet,
    wherein the non-contact connecting portion electrically extends from the base end of the contact connecting portion to an inside of the base sheet to provide electrical conduction between the contact connecting portion and the touching portion, and
    wherein the touching portion is allowed to be electrically conductive with the finger of the user via the contact connecting portion when the finger of the user comes into touched state with the contact connecting portion so as to change the capacitance of corresponding touching areas of the multi-touch display of the information processing device.

* * * * *